US011108981B2

(12) United States Patent
Zimmerman et al.

(10) Patent No.: US 11,108,981 B2
(45) Date of Patent: Aug. 31, 2021

(54) COMPACT, LOW POWER, HIGH RESOLUTION ADC PER PIXEL FOR LARGE AREA PIXEL DETECTORS

(71) Applicant: Fermi Research Alliance, LLC, Batavia, IL (US)

(72) Inventors: Tom Zimmerman, St. Charles, IL (US); Grzegorz Deptuch, Forest Park, IL (US); Farah Fahim, Glen Ellyn, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 38 days.

(21) Appl. No.: 16/557,262

(22) Filed: Aug. 30, 2019

(65) Prior Publication Data
US 2020/0077039 A1  Mar. 5, 2020

Related U.S. Application Data

(60) Provisional application No. 62/726,422, filed on Sep. 3, 2018.

(51) Int. Cl.
*H04N 5/378* (2011.01)
*H03M 1/46* (2006.01)
(Continued)

(52) U.S. Cl.
CPC ........... *H04N 5/378* (2013.01); *H03K 5/2472* (2013.01); *H03M 1/462* (2013.01); *H03M 1/466* (2013.01);
(Continued)

(58) Field of Classification Search
CPC .... H03F 3/345; H03K 5/2472; H03K 5/2481; H03M 1/462; H03M 1/466; H04N 5/32; H04N 5/3698; H04N 5/3741; H04N 5/378
See application file for complete search history.

(56) References Cited

U.S. PATENT DOCUMENTS 6,252,536 B1 *  6/2001  Johnson ................ H03M 1/187
                                                 330/253
6,701,340 B1 *  3/2004  Gorecki ..................... G06J 1/00
                                                 708/671

(Continued)

OTHER PUBLICATIONS

Gabriella Carini, et al., "3D-Hybridized MAPS and Readout ASIC Pixel Detector for Soft X-Rays with In-Pixel A-to-D Conversion", Abstract, AIP Conference Proceedings 2054, 060063 (2019).
(Continued)

*Primary Examiner* — Amy R Hsu
(74) *Attorney, Agent, or Firm* — Kevin L. Soules; Loza & Loza, LLP

(57) ABSTRACT

A compact ADC circuit can include one or more comparators, and a serial DAC (Digital-to-Analog) circuit that provides a signal to the comparator (or comparators). In addition, the ADC circuit can include a serial DAC redistribution sequencer that can provide a plurality of signals as input to the serial DAC circuit and is subject to a redistribution cycle and which receives as input a signal from a data multiplexer whose input connects electronically to an output of the comparator. The circuit can further include an ADC code register that provides an ADC output that connects electronically to the output of the comparator and the input to the data multiplexer. Shared logic circuitry for sharing common logic between pixels can be included, wherein the shared logic circuitry connects electronically to the data multiplexer and the ADC code register, wherein the shared logic circuitry promotes area and power savings for the pixel detector circuit.

19 Claims, 10 Drawing Sheets

(51) Int. Cl.
*H04N 5/369* (2011.01)
*H04N 5/374* (2011.01)
*H03K 5/24* (2006.01)

(52) U.S. Cl.
CPC ......... *H04N 5/3698* (2013.01); *H04N 5/3741* (2013.01)

(56) References Cited

U.S. PATENT DOCUMENTS

| | | |
|---|---|---|
| 6,724,889 B1 | 4/2004 | Giles et al. |
| 7,504,882 B2* | 3/2009 | Saito ............... G11C 7/067 330/253 |
| 7,852,154 B2 | 12/2010 | Cooney |
| 9,264,643 B1* | 2/2016 | Xue ............... H04N 5/3575 |
| 10,277,843 B2* | 4/2019 | Smith ............... H04N 5/3559 |
| 10,313,616 B2* | 6/2019 | Jung ............... H04N 5/3577 |
| 2005/0067576 A1 | 3/2005 | Caria |
| 2005/0104003 A1* | 5/2005 | Jarron ............... H03F 3/087 250/370.14 |
| 2007/0134906 A1 | 6/2007 | Nygard |
| 2014/0043511 A1* | 2/2014 | Iwata ............... H04N 5/3741 348/308 |
| 2016/0182075 A1* | 6/2016 | Devarajan ............. H03M 1/128 341/120 |
| 2017/0134680 A1 | 5/2017 | Zhong et al. |
| 2017/0350756 A1* | 12/2017 | Panicacci ............... G01J 1/4228 |
| 2017/0373110 A1 | 12/2017 | Von Kanel |

OTHER PUBLICATIONS

Gabriella Carini, "Detector challenges for LCLS-II FLORA: LCLS/SLAC and Fermilab collaboration", Jun. 20, 2017, SLAC National Accelerator Laboratory.

* cited by examiner

COMPACT, LOW POWER, HIGH RESOLUTION ADC PER PIXEL FOR LARGE AREA PIXEL DETECTORS

CROSS-REFERENCE TO PROVISIONAL APPLICATION

This patent application claims priority under 35 U.S.C. 119(e) to U.S. Provisional Patent Application Ser. No. 62/726,422 entitled "Compact, Low-Power, High Resolution ADC Per Pixel for Large Area Pixel Detectors" which was filed on Sep. 3, 2018, the disclosure of which is incorporated herein by reference in its entirety.

STATEMENT OF GOVERNMENT RIGHTS

The invention disclosed in this application was made with U.S. Government support under the Fermi Research Alliance, LLC, Contract Number DE-AC02-07CH11359 awarded by the U.S. Department of Energy. The U.S. Government has certain rights in the invention.

TECHNICAL FIELD

Embodiments are generally related to the field of integrated circuits. Embodiments further relate to the field of pixel detectors. Embodiments also relate to the field of large area pixel detectors and ADC (Analog-to-Digital Converter) and DAC (Digital-to-Analog Converter) circuits. Embodiments further relate to the field of semiconductor radiation detectors and to hybrid pixel sensors or detectors.

BACKGROUND

A pixel detector, also referred to as a pixel sensor, is a type of image detector or image sensor, wherein each picture element ("pixel") has a photodetector and an amplifier. Many different type of integrated circuit pixel detectors have been implemented, including the APS (Active-Pixel Sensor) such as the CMOS (Complementary Metal-Oxide-Semiconductor) APS used cell phone cameras, web cameras, digital pocket cameras and digital single-lens reflex cameras. Such image sensors can be produced using CMOS technology and has emerged as an alternative to CCD (Charge-Coupled Device) image sensors.

Another type of pixel detector is a hybrid pixel detector. Such devices are usually configured from semiconductor wafers, most frequently high resistivity silicon, in which are implanted by ion reactor processing or thin film deposit tiny (micrometers) structures, each of them acting as a single element of a detector. When radiation impinges into such detectors, electron-hole pairs are generated and, if adequate electric field is created in the structure, they drift and are collected to the pixels. The corresponding electrical current induced by the charge movement is transferred to an external electronic microchip circuit. Such a system is referred to as a "hybrid pixel detector".

Pixel detectors find particularly applications in the field of radiation detection. Current digital imaging devices for energetic particle detection, also called pixel detectors, can be classified into two broad classes, distinguished by the way in which impacting energy is converted into electrical signals. Taking X-ray photons as an example, in the first one of these classes the conversion happens indirectly in the sense that X-ray photons are first down-converted in energy to visible photons in a scintillation layer. The visible photons are subsequently detected by an array of photodiodes, in which the optical generation of electron-hole pairs gives rise to electrical signals which are then further processed by a readout electronics and represented as an image on a computer screen. The two-stage conversion process of indirect X-ray imaging devices suffers from the drawback of limited conversion efficiency and spatial resolution because of losses and scattering occurring both during the conversion of X-rays into visible photons and in the detection of those. Typically about 25 electron-hole pairs are finally measured by the readout electronics per keV of incident X-ray energy.

In the second class of these pixel detectors semiconductor absorbers permit the direct conversion of X-rays into electron-hole pairs, which can then be measured as an electrical signal by readout electronics. In addition to superior sensitivity and higher spatial and temporal resolution compared to scintillator based indirect conversion, such absorbers offer also spectral resolution, since the energy of an incident X-ray photon is proportional to the number of generated electron-hole pairs and thus measurable by a pulse height analysis.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved pixel detector circuit.

It is another aspect of the disclosed embodiments to provide for a compact, low power, high resolution ADC per pixel for large area pixel detectors.

The aforementioned aspects and other objectives and advantages can now be achieved as described herein. In an embodiment, a circuit can be implemented which can include at least one unity-gain buffer having a zero input capacitance; a comparator having a constant offset invariant of signal and common mode, wherein the at least one unity-gain buffer is electrically connected to the comparator; and a capacitor trimming circuit that is electrically connected to the comparator via the at least one unity-gain buffer.

In an embodiment of the circuit, the at least one unity-gain buffer can comprise a high-performance follower.

In an embodiment of the circuit, the comparator can comprise a high-gain, wide common mode range comparator with an input signal range equivalent to a full swing of nominal supply voltage.

In an embodiment of the circuit, the capacitor trimming circuit can facilitate sub-fF capacitor trimming suitable for a reduced chip area occupancy. In another embodiment, the sub-fF capacitor trimming can be facilitated by electronic bootstrapping an electrode of a capacitor via the at least one unity-gain buffer. In yet another embodiment, the sub-fF capacitor trimming can be facilitated by connecting an electrode of a capacitor to a constant voltage source.

In another embodiment, a circuit can include at least one high-performance follower that combines at least one high-voltage-threshold transistor and at least one low-voltage-threshold transistor with surrounding circuitry to achieve a unity gain, zero input capacitance, and a wide input signal range equal to a full swing of a nominal supply voltage.

In an embodiment, the circuit can include a high-performance comparator that uses the at least one high-performance follower and the at least one high-voltage-threshold transistor and the at least one low-voltage-threshold transistor to achieve a comparator with a high gain, zero input capacitance, wide input signal range equal to a full swing of the nominal supply voltage, and an invariant input offset over a complete dynamic range.

In an embodiment, the circuit can include a capacitance trimming circuit that uses the at least one high-performance follower and an electronic bootstrapping to achieve a sub-fF capacitance trimming.

In another embodiment, a circuit can include at least one high-performance follower that combines at least one high-voltage-threshold transistor and at least one low-voltage-threshold transistor with surrounding circuitry to achieve a unity gain, zero input capacitance, and a wide input signal range equal to a full swing of a nominal supply voltage; a high-performance comparator that uses the at least one high-performance follower and the at least one high-voltage-threshold transistor and the at least one low-voltage-threshold transistor to achieve a comparator with a high gain, zero input capacitance, wide input signal range equal to a full swing of the nominal supply voltage, and an invariant input offset over a complete dynamic range; and a capacitance trimming circuit that uses the at least one high-performance follower and an electronic bootstrapping to achieve a sub-fF capacitance trimming.

The circuit can also include shared logic circuitry for sharing common logic between pixels, wherein the shared logic circuitry promotes area savings and power savings. The capacitance trimming circuit can be electrically connected to the high-performance comparator via the at least one at least one high-performance follower.

In another embodiment, a pixel detector circuit and a method of use are disclosed herein. The pixel detector circuit can include one or more comparators, along with a serial DAC (Digital-to-Analog) circuit that provides a signal to the comparator (or comparators). In addition, such the pixel detector circuit can be configured to include a serial DAC redistribution sequencer that is driven by a data multiplexer, providing a plurality of signals as input to the serial DAC circuit, and the serial DAC circuit is subject to a redistribution cycle. The redistribution sequencer receives as input a signal from a data multiplexer whose input connects electronically to the ADC code register. The circuit is further configured to include an ADC code register that provides an ADC output that connects electronically to the output of the comparator and the input to the data multiplexer. A method for sharing part of the logic that drives pixels is included, wherein the shared logic circuitry connects electronically to the data multiplexer and the ADC code register, wherein the shared logic circuitry promotes area and power savings for the pixel detector circuit.

In some embodiments, the shared logic circuitry can be configured to include a DAC conversion number register and a DAC input bit select register that perform timing and control functions, wherein the DAC conversion number register and the DAC input bit select register are shared among a group of multiple ADCs resulting in the area and the power savings. The DAC conversion number register is reusable for DAC control by enabling stored bits from the ADC code register using at least one tri-state buffer in the data multiplexer, and the DAC input bit select register is also reusable.

The disclosed ADC concept can also be used in applications other than pixel detectors. That is, the disclosed ADC concept can be implemented in the context of a compact ADC, which fits in a small footprint.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
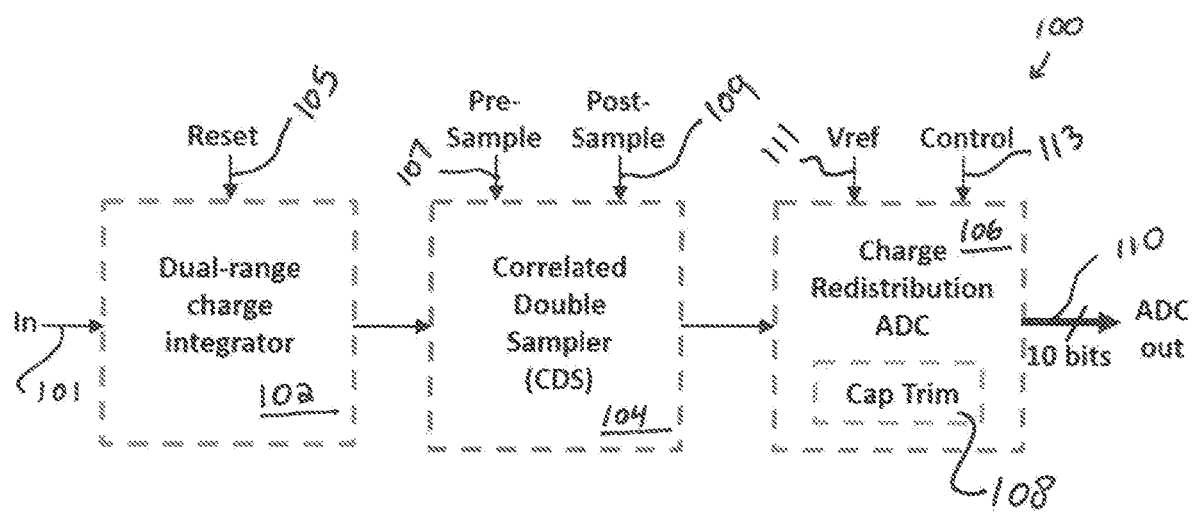
FIG. 1 illustrates a block diagram depicting an analog pixel circuit, in accordance with an embodiment.

The particular values and configurations discussed in these non-limiting examples can be varied and are cited merely to illustrate one or more embodiments and are not intended to limit the scope thereof.

Subject matter will now be described more fully herein after with reference to the accompanying drawings, which form a part hereof, and which show, by way of illustration, specific embodiments. Subject matter may, however, be embodied in a variety of different forms and, therefore, covered or claimed subject matter is intended to be construed as not being limited to any embodiments set forth herein; embodiments are provided merely to be illustrative. Likewise, a reasonably broad scope for claimed or covered subject matter is intended. Among other things, for example, subject matter may be embodied as methods, devices, components, or systems/devices. Accordingly, embodiments may, for example, take the form of hardware, software, firmware or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an embodiment" and variations thereof as utilized herein do not necessarily refer to the same embodiment and the phrase "in another embodiment" or "in another embodiment" and variations thereof as utilized herein may or may not necessarily refer to a different embodiment. It is intended, for example, that claimed subject matter include combinations of embodiments in whole or in part.

In general, terminology may be understood, at least in part, from usage in context. For example, terms, such as "and", "or", or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the terms "at least one" and "one or more" as used herein, depending at least in part upon context, may be used to describe any feature, structure, or characteristic in a singular sense or may be used to describe combinations of features, structures, or characteristics in a plural sense. Similarly, terms such as "a", "an", or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context. Additionally, the term "step" can be utilized interchangeably with "instruction" or "operation".

Unless defined otherwise, all technical and scientific terms used herein have the same meanings as commonly understood by one of ordinary skill in the art. As used in this document, the term "comprising" means "including, but not limited to."

One example of a pixel detector is the FLORA (Fermilab-LCLS CMOS 3D-integRated detector with Autogain) device, which is a large dynamic range and continuous, fast readout rate pixel detector conceived to exploit the high repetition rate operation at LCLS-II with focus on soft X-rays. Note that the acronym LCLS refers to Linac Coherent Light Source, which is a hard X-ray free-electron laser. LCLS-II, on the other hand, refers to a transformative tool for energy science, qualitatively changing the way that X-ray imaging, scattering and spectroscopy can be used to study how natural and artificial systems function. LCLS-II will enable new ways to capture rare chemical events, characterize fluctuating heterogeneous complexes, and reveal quantum phenomena in matter, using nonlinear, multidimensional and coherent X-ray techniques that are possible only with X-ray lasers. The LCLS-II facility will operate in a soft X-ray range (250 eV to 1.5 keV), and will use seeding technologies to provide fully coherent X-rays in a uniformly spaced series of pulses with programmable repetition rate and rapidly tunable photon energies.

A FLORA detector can fulfill the needs of the new storage rings and its concept extends to soft and harder X-rays. The target for a FLORA device is a sensitivity to X-ray photon energies from the range from 250 eV to 2 keV, allowing detection of a single photon and extending the dynamic range to $10^4$ photons per pixel per frame. The FLORA detector structure is planned for large area coverage in a form of tileable square, or generally rectangular, modules of up to a few cm per side, arranging in a structure with a central hole and high vacuum compatible. The detector module can be implemented as a hybridized device in which the structural support function is fulfilled by a sensing layer to which readout integrated circuits are bonded using the high-density interconnect technology to yield pixelated detectors with pixels of $50\times50$ microns$^2$ or less.

Note that the discussion herein regarding FLORA and pixel detectors such as the aforementioned FLORA detector should not be considered limiting features of the disclosed embodiments. That is, a FLORA detector is merely one type of detecting system or apparatus to which the disclosed embodiments may be applied. It can be appreciated that the disclosed embodiments can be applied to other types of pixel detectors and other types of circuits and applications. The discussion herein of a FLORA detector is provided for exemplary and illustrative purposes only, and to illustrate one possible embodiment.

In general, a FLORA pixel must integrate and digitize a signal charge of wide dynamic range in a very small area (e.g., approximately $35\times40$ microns$^2$, while the total pixel size is $50\times50$ microns$^2$) at a rate in the range of 10-100 kS/s. A crucial component of the analog circuitry is a 10-bit successive approximation register ADC (SAR ADC) with a 0-1.2 V range (full nominal supply swing of the technology used in the implementation) with a DAC, which is based on a charge redistribution technique. To achieve the required specifications of this ADC in such a restrictively small area, several novel circuit blocks have been developed:

Analog Section:
 1. A wide dynamic range (1.2 V) unity-gain buffer with zero input capacitance
 2. A high-gain, wide common-mode range (1.2 V) comparator with constant offset
 3. A simple, method of sub-fF capacitor trimming suited for small chip area occupancy An Integrated Circuit process with a wide variety of transistor types is required to implement the ADC. (Note that the voltages correspond to a 65 nm process platform however the general concept is applicable irrespective of the technology node and such voltages and other parameters should not be considered limiting features of the disclosed embodiments). Thin-oxide transistors can be sized at the process minimum dimensions, and operate with a supply voltage of 1.2 V. Nominal-VT, Low-VT (LVT), and High-VT (HVT) transistors are available for both NMOS and PMOS thin-ox transistors. Thick-ox transistors have larger minimum dimensions and operate with a supply voltage of up to 2.5V.

FIG. 1 illustrates a block diagram depicting an analog pixel circuit 100, in accordance with an embodiment. In particular, the block diagram of the analog portion of the pixel is shown in FIG. 1. The analog pixel circuit 100 can include three circuits or sub-circuits, including a dual-range integrator 102, a CDS (Correlated Double Sampler) 104, and a charge redistribution ADC 106. The CDS 104 can include a capacitor trimming circuit 108 (i.e. labeled as "Cap Trim" in FIG. 1).

An input 101 (e.g., an input signal) can be provided to the dual-range integrator 102, which is also subject to a reset 105 (e.g., a reset signal). The output from the dual-range integrator 102 can be input to the CDS 104. The CDS can be subject to a pre-sample 107 (e.g., a pre-sample signal) and a post-sample 109 (e.g., a post-sample signal). The output from the CDS 104 can be provided as input to the charge redistribution ADC 106, which in turn can provide an ADC output 110 (e.g., 10 bits). The CDS can be subject to a reference voltage 111 (also labeled as "Vref" in FIG. 1) and a control 113 (e.g., a control signal).

The CDS 104 can be employed between the output of the dual-range charge integrator 102 and the input to the charge redistribution ADC 106 for multiple reasons. First, the CDS 104 can filter out the low frequency noise of the dual-range charge integrator and the kTC noise from the integrator reset 105, both of which can be significant. Second, the relatively large capacitors employed in the CDS load and the integrator output can limit its bandwidth, thereby limiting the high frequency noise. Third, because the sampled signal is a voltage held on a relatively large capacitance, it can remain stable over the entire digitization period (e.g., tens of microseconds).

The configuration of the dual-range charge integrator 102 and the CDS 104 is relatively straightforward. One of the important challenges of the FLORA pixel, for example, is to design a linear, monotonic 10-bit ADC in a very small area. Since plenty of time is available for digitization (e.g., on the order of 10 to 100 us), an appropriate ADC architecture may implement many iterative serial operations in exchange for simplicity and small size. The charge redistribution technique discussed herein can thus be implemented by a simple serial charge redistribution DAC, whose output can be iteratively adjusted and compared to the voltage to be digitized until they are essentially equal. Some of the main challenges in the ADC design may involve designing a high-performance comparator and developing a method of trimming the small DAC capacitors to high precision.

Figure 2:
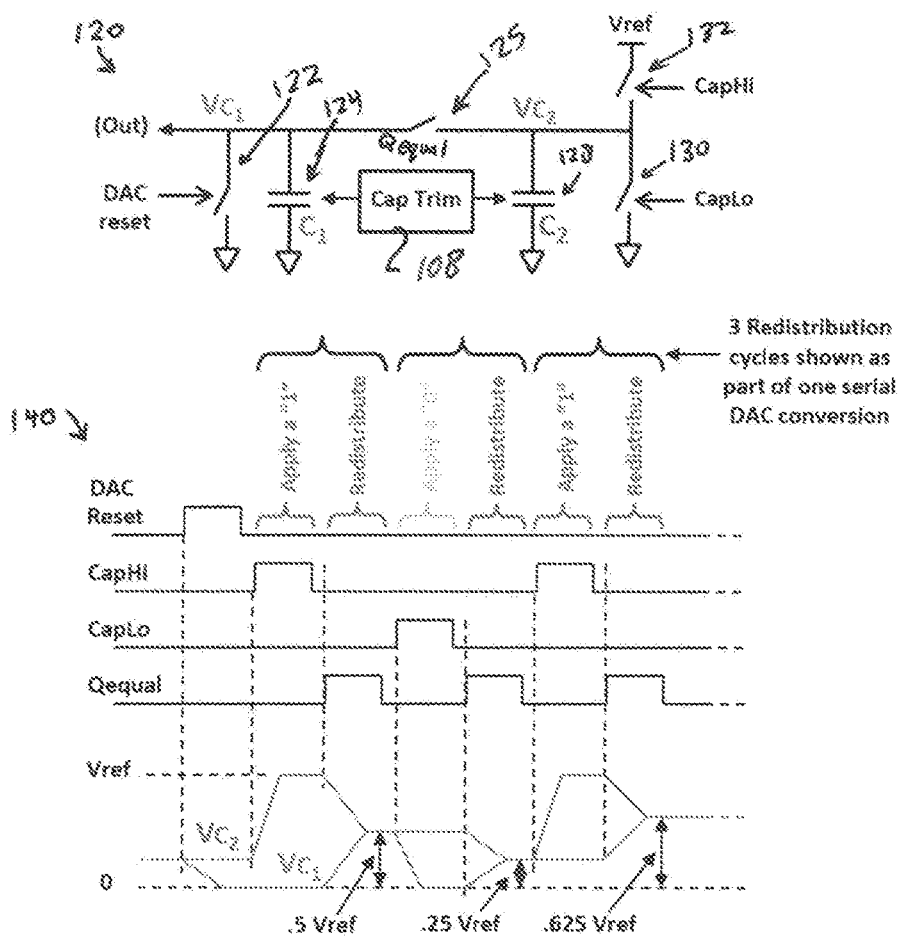
FIG. 2 illustrates a schematic diagram depicting serial DAC (Digital-to-Analog Converter) circuit and a timing diagram depicting cycles with respect to serial charge redistribution DAC, in accordance with an embodiment.

FIG. 2 illustrates a circuit diagram depicting a serial charge redistribution DAC 120, in accordance with an embodiment. The serial charge redistribution DAC 120 can be used with the charge redistribution ADC 106 is shown in FIG. 1. The serial charge redistribution DAC 120 shown in FIG. 2 can include a first capacitor 124 and a second capacitor 128, which can be subject to the capacitor trimming circuit 108, which can be in some embodiments, the same capacitor trimming circuit 108 shown in FIG. 1. The first capacitor 124 is labeled $C_1$ in FIG. 2, and the second capacitor 128 is labeled as $C_2$ in FIG. 2.

The serial charge redistribution DAC 120 can further include a switch 122 that functions as a DAC reset, and a switch 125 (also labeled as "Qequal" in FIG. 2) located between the first capacitor 124 and the second capacitor 128. The serial charge redistribution DAC 120 can also include a switch 130 and a switch 132 that can be connected electrically to the second capacitor 128 and also, when the switch 125 is closed, to the first capacitor 124. The first capacitor 124 and the second capacitor 128 need to be of equal capacitance value and the switch 125, the switch 124, the switch 128, the switch 130 and/or the switch 132 can be utilized to route a charge to the first capacitor 124 and/or the second capacitor 128.

The voltage on the first capacitor 124 or $C_1$ can be the output of the serial charge redistribution DAC 120, which starts out at 0 V. A 10-bit output voltage can be formed by charging the second capacitor 128 or $C_2$ to either Vref or 0 V, and then connecting the first capacitor 124 and the second capacitor 128 together to equalize (redistribute) the charge, followed by performing this procedure a number of times (e.g., 10 times). The LSB (Least Significant Bit) of the DAC word can be performed first, and the MSB (Most Significant Bit) last. The accuracy of the serial charge redistribution DAC 120 may be limited by the precision of capacitor matching, the effect of the parasitic capacitances and charge injection of the switches, and by any loading or influence of subsequent circuitry that is connected to the output of the serial charge redistribution DAC 120.

Note that these voltages, capacitor sizes, matching properties, etc. correspond to a selected technology node. This technique, however, can be applicable to other technology nodes. The choice of capacitors depends on the matching properties of the capacitors in a technology (e.g. MIM (metal-insulator-metal) caps). The choice of a capacitor depends on the selection offered by a particular technology, matching properties, size and capacitance per area ratio (i.e., $fF/\mu m^2$). The concept given as the 10-bit ADC may be applicable for more or less than a 10-bit conversion.

The DAC capacitors used should have a very low voltage dependence coefficient to preserve linearity, which precludes using MOScaps. MOMcaps (metal-oxide-metal) are chosen for this purpose since they are linear, easy to implement, and have relatively high capacitance per unit area. The extremely limited area available in the pixel, however, may limit the practical value of these capacitors to several hundred fF. This presents a major challenge, since an accurate 10-bit DAC may require capacitor matching to be better than 0.1%, which may not be achievable with such small capacitor values without trimming. In addition, the non-linear parasitic capacitance and charge injection of the switches can also cause significant errors when the capacitors are this small. Also, the load presented by any conventional circuitry connected to the DAC output may be significant enough to compromise performance.

These problems can be addressed as follows. First, only near-minimum sized thin-oxide (1.2V) transistor switches can be used, since thick-oxide switches can introduce too much error. Since it is desirable to have the DAC range be as large as practical to maximize the ADC bin size, the DAC range can be chosen to be 0-1.2 V, which is the maximum allowable with thin-oxide switches. This choice can allow for seamless interfacing with the digital logic on the chip, since the logic also runs on a 1.2 V supply. Second, a new method of trimming of capacitors can be implemented, which allows trimming with a granularity of tens of aF (10E-18 F). This allows the DAC capacitors such as the first capacitor 124 and the second capacitor 128 to be adjusted on a per-pixel basis to match to significantly better than 0.1%.

FIG. 2 further illustrates a timing diagram 140 depicting cycles with respect to the serial charge redistribution DAC 120. The timing diagram 140 shown in FIG. 2 demonstrates example timing signals with respect to DAC Reset, CapHi, CapLo, Qequal, and Vref. Three redistribution signals are depicted in the timing diagram as part of one serial DAC conversion.

Figure 3:
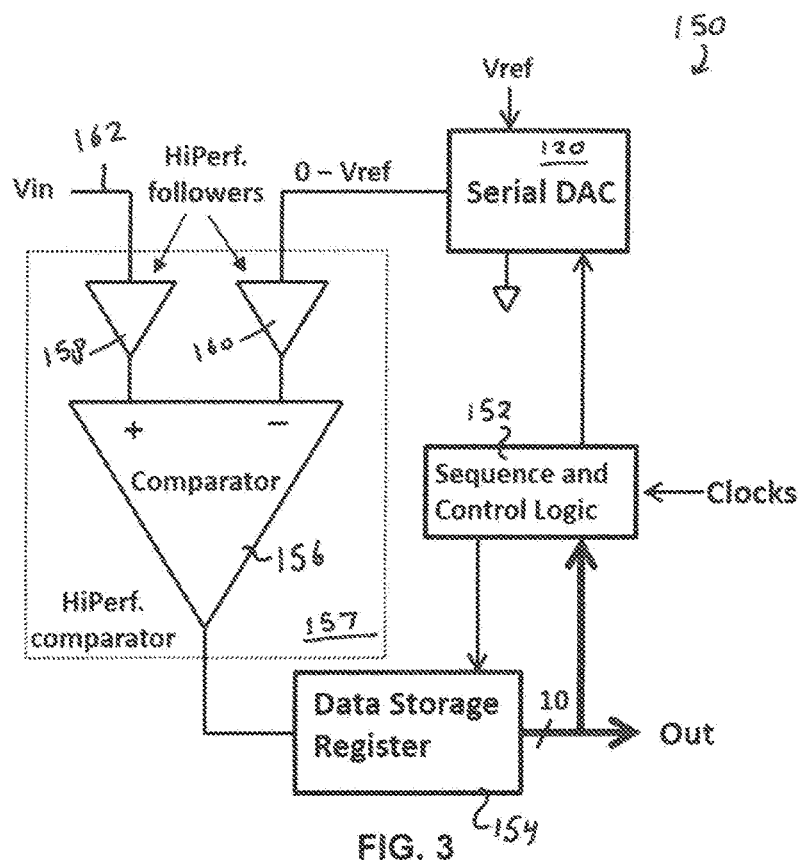
FIG. 3 illustrates a schematic diagram depicting charge redistribution ADC, in accordance with an embodiment.

FIG. 3 illustrates a circuit diagram depicting a charge redistribution ADC 150, in accordance with an embodiment. The charge redistribution ADC 150 shown in FIG. 3 can be implemented as a 10-bit ADC, which can incorporate the serial charge redistribution DAC 120 shown in FIG. 2. The charge redistribution ADC 150 can include a high-performance comparator 157 that includes a comparator 156 and an amplifier 158 and an amplifier 160. An input voltage 162 can be provided to the amplifier 158 and a reference voltage can be provided to the amplifier 160. The amplifier 158 and the amplifier 160 can each function as a high performance follower. The reference voltage can offer a reference voltage in a range of that includes 0 Volts to a voltage Vref.

The charge redistribution ADC 150 further includes a serial DAC 120 that is also subject to a reference voltage, which can also be labeled as Vref. The serial DAC 120 is also connected to ground and can receive an output of sequential and control logic 152, which may be implemented as a circuit or sub-circuit subject to a clock signal ("Clocks" as shown in FIG. 3). The output from the sequential and control logic 152 is thus input to the serial DAC 120. The sequential and control logic 152 outputs a signal which is fed as an input to a data storage register 154, which in turn provides an output ("Out" as shown in FIG. 3) that can also be fed as an input to the sequential and control logic 152. An output from the high-performance comparator 157 is fed as input to the data storage register 154.

A series of 10 DAC output voltages (ranging between 0 and Vref) can be compared with the input voltage Vin. First, presenting a DAC voltage of Vref/2 and comparing it to the input can determine the MSB of the ADC conversion. The result of any given comparison determines the next DAC value to try. After presenting the $10^{th}$ and final DAC voltage and observing the result of the comparison (which is the LSB), the conversion can be complete.

At the heart of the charge redistribution ADC 150 is the high-performance ("HiPerf") comparator circuit 157 that can include the amplifier 158, the amplifier 160, and the comparator 156. As discussed above, the amplifier 158 can provide an output that is provided as input to the comparator 156. The amplifier 160 can also provide an output that is fed as input to the comparator 156. This high-performance comparator circuit 157 has several very challenging specifications, which require some new ideas. That is, the high-performance comparator circuit 157 should preferably have a 1.2 V common mode range, and a reasonably low and constant input offset over the entire range. The high-performance comparator circuit 157 should also have a very high gain so that it can resolve input differences of <1 mV, and be able to render a decision within a few hundred ns in all cases.

Because the input to the high-performance comparator circuit 157 can be connected to the output of the serial charge redistribution DAC 120, which may be simply one of the two matched DAC capacitors 124 or 128, the serial charge redistribution DAC 120 should also have effectively zero input capacitance. This may require high-performance input followers to isolate the actual comparator inputs from the other circuitry. A "HiPerf" (high-performance) follower can be defined as having a 1.2 V range, a constant gain and an offset over that whole range, and an input capacitance of (practically) zero.

In summary, the high-performance comparator circuit 157 should include high-performance input followers with constant gain and offset, a 1.2V range and a constant offset, an input capacitance equal to zero, a high gain with inputs that can resolve <1 mV, and a decision in a range that is less than a few hundred ns (nanoseconds).

Figure 4:
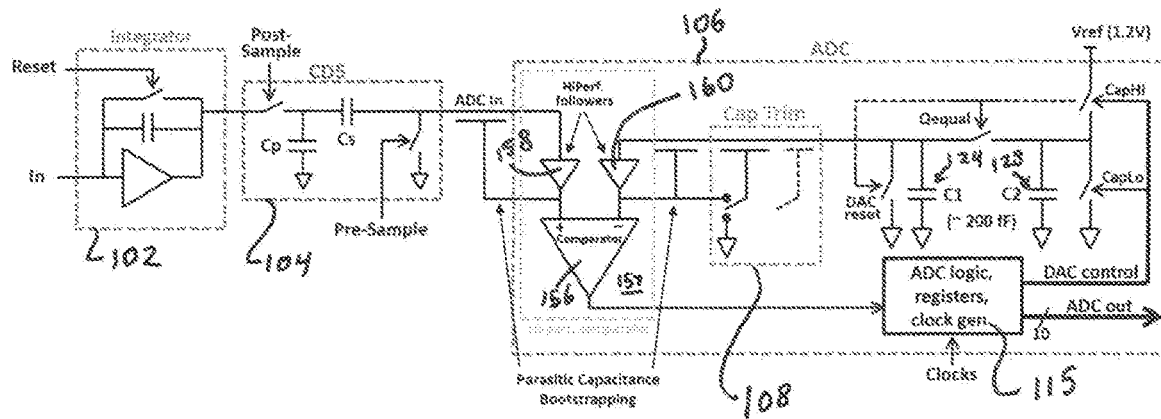
FIG. 4 illustrates a schematic diagram depicting an analog pixel circuit and a pixel simplified timing diagram in accordance with an embodiment.
Figure 4:
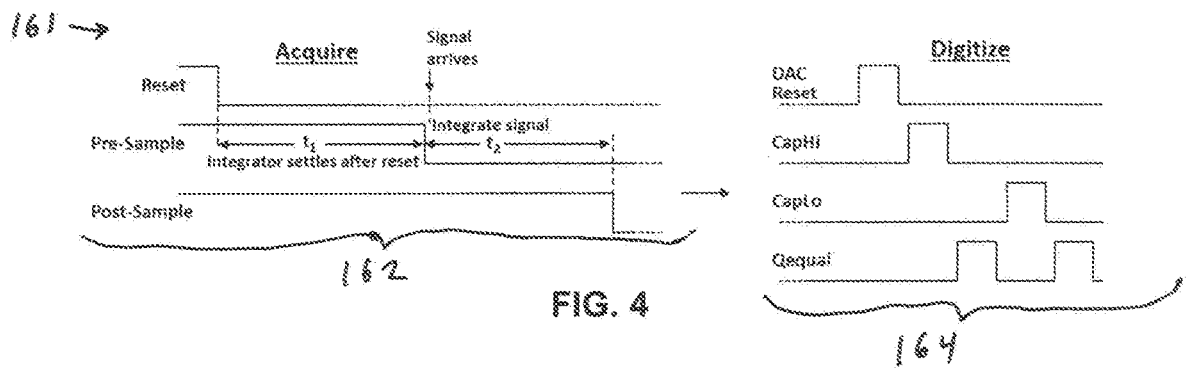

FIG. 4 illustrates a schematic diagram depicting a more detailed view of the analog pixel circuit 100 and further depicting a pixel simplified timing diagram 161 in accordance with an embodiment. As shown in FIG. 4, the pixel simplified timing diagram 161 includes an acquire portion 162 and a digitize portion 164.

Figure 5:
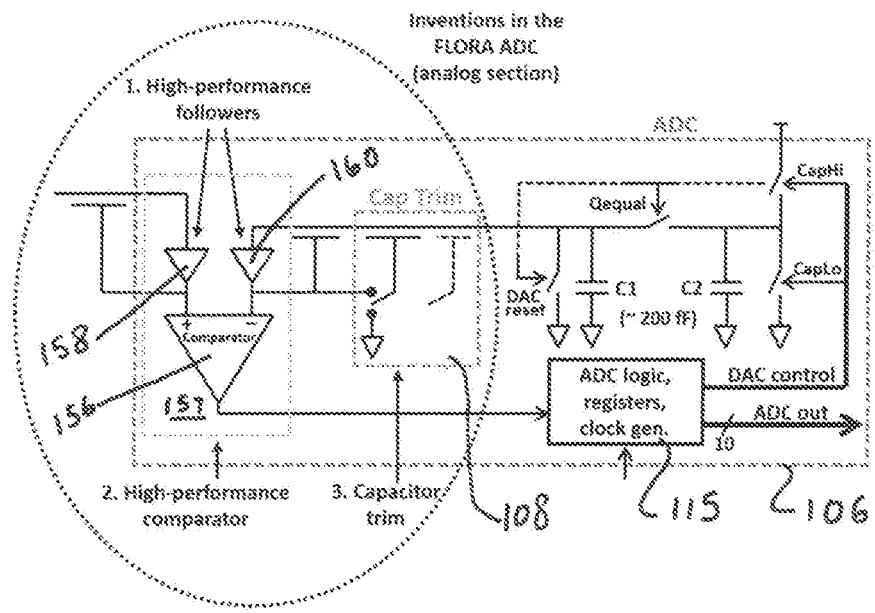
FIG. 5 illustrates a schematic diagram of the charge redistribution ADC 106, in accordance with an embodiment.

The pixel simplified schematic diagram of the analog FLORA pixel design of the analog pixel circuit 100 as depicted in FIG. 5 illustrates important blocks, including the charge redistribution ADC 106. As a reminder, similar or identical reference numerals discussed and illustrated herein refer to similar or identical parts or elements. The analog pixel circuit 100 shown in FIG. 4 includes the previously discussed dual-range charge integrator 102, the CDS 104, and the charge redistribution ADC 106.

The charge redistribution ADC 106 includes the previously discussed high-performance comparator 157, the capacitor trimming circuit 108 (i.e. which is also labeled as "Cap Trim" in FIG. 4), and a circuit block 115 that can include ADC logic, registers, and clock generation ("clock gen") circuitry. Output from the circuit block 115 can include an ADC output signal (i.e., labeled as "ADC out" in FIG. 4) and a DAC control signal (i.e., labeled as "DAC control" in FIG. 4). The DAC control signal can be provided as a charge-capacitance-to-high signal (i.e., labeled as "CapHi" in FIG. 4) and a charge-capacitance-to-low signal (i.e., labeled as "CapLo" in FIG. 4). The charge redistribution ADC 106 can further include electrical components such as a capacitor C1 and a capacitor C2, a DAC reset switch (i.e., labeled as "DAC reset" in FIG. 4), and so on.

The dual-range charge integrator 102 can be initially reset to establish the baseline when there is no signal. The dual-range charge integrator 102 output can directly feed the Correlated Double Sampler (CDS) 104. The CDS 104 can be composed of a parallel capacitor Cp sampled with a Post-Sample switch (i.e., labeled as "Post-Sample" in FIG. 4), and a series coupling capacitor Cs whose output can be initially reset to ground (the bottom of the ADC range) with a Pre-Sample switch (i.e., labeled as "Pre-Sample" in FIG. 4). Both the Pre-Sample switch and the Post-Sample switch can be closed during a reset period of the dual-range charge integrator 102. After the integrator reset is opened, an integrator output can be allowed to settle for time $t_1$ (see time $t_1$ of the digitize portion of the timing diagram 161) before the Pre-Sample switch is opened.

After the Pre-Sample switch is opened, the DC integrator baseline level (e.g., including charge injection, low frequency integrator noise and the kTC noise from opening the integrator reset switch) can be stored on a series coupling capacitor Cs, effectively subtracting this offset from the signal presented to the subsequent circuitry. After Pre-Sample, the signal can arrive and be integrated during time $t_2$ as shown in the acquire portion 162 of the timing diagram 161. The change in integrator output (i.e., the integrated signal) can be coupled via Cs to the ADC input (labeled as "ADC in" in FIG. 4). Note that a compact ADC can be implemented standalone or in other applications without the Integrator and the CDS blocks.

Note that any capacitance on the inputs of the high-performance comparator will compromise the ADC performance. Capacitance at the positive input loads the series coupling capacitor Cs that drives the CDS output, and can cause attenuation of the ADC input signal. Capacitance at the negative input can add to the C1 capacitor in the serial DAC, causing a C1-C2 mismatch and compromising the accuracy of the ADC 106.

FIG. 5 illustrates a schematic diagram of the charge redistribution ADC 106, in accordance with an embodiment. FIG. 5 illustrates circuit configurations that can be contained in the FLORA ADC. First, the design and operation of the high-performance follower will be explained. Then, the high-performance comparator 157 is discussed, which is a novel comparator design with each of its inputs driven by a high-performance follower such as the comparator 158 and the comparator 160. Finally, a sub-fF capacitor trimming method is explained.

Designing a high-performance follower with a 0-1.2 V range is a challenging task. This section lays out steps that may be required to arrive at a final solution. Each of the intermediate steps may result in a version of a high-performance follower that can be useful in a variety of applications. Each of these intermediate versions, however, has some performance limitation that may preclude its use for the FLORA application, and only a final version may be suitable for FLORA.

A fundamental principle that can be exploited in all versions of the follower is electronic bootstrapping, which can also be referred to simply as bootstrapping. Electronic bootstrapping can involve causing the voltages on all terminals (including the bulk) of a MOS transistor to move by (ideally) the same amount in response to a change in voltage on the gate (e.g., see the parasitic capacitance bootstrapping feature in FIG. 4). If this condition can be met, the gain of the follower will be exactly one, and the input capacitance at the gate will be zero. Existing circuit topologies that follow this approach may use a PMOS follower, since the bulk (Nwell) can be easily attached to the source. Then, the follower drain voltage can be forced to follow the source voltage by means of another follower or combination of transistors.

Figure 6:
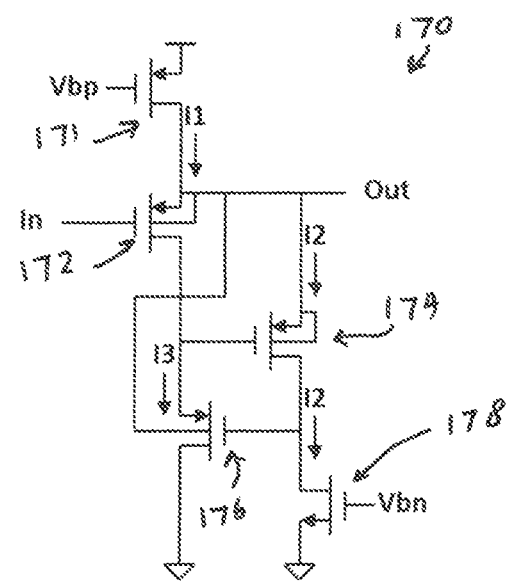
FIG. 6 illustrates a schematic diagram of an enhanced follower circuit, in accordance with an embodiment.

FIG. 6 illustrates an example of this, which can be found in "A novel source-drain follower for monolithic active pixel sensors", C. Gao, et. al., NIM A 831 (2016), pp. 147-155, which is incorporated herein by reference in its entirety. FIG. 6 generally illustrates a schematic diagram of an enhanced follower circuit 170, which can be implemented in accordance with an embodiment. Note that the term "follower circuit" can be utilized interchangeably herein with the term "follower" to refer to the same circuit or same type of circuit or circuit element. The enhanced follower circuit 170 shown in FIG. 6 can possess the desired properties of a high-performance follower over a certain range. The enhanced follower circuit 170 can include a transistor 171, which can provide a current I1 that is input to a transistor 172. The enhanced follower circuit 170 can further include a transistor 174, which can receive a current I2 that is output to a transistor 178. In addition, the enhanced follower circuit 170 includes a transistor 176 that is subject to a current I3, and which in turn can be connected to ground. The transistor 178 can also be connected to ground and can be subject to a voltage Vbn.

The enhanced follower circuit 170 can thus use two current sources, a PMOS (I1) and an NMOS (I2). The quiescent current through the follower input transistor is (I1-I2), which must remain constant to maintain constant gain and offset. Therefore, the performance quickly degrades for inputs less than several hundred mV, since the voltage across the NMOS current source goes to zero. This follower design does not come close to meeting the desired dynamic range for FLORA Since the FLORA high-performance buffer must have a valid input range of 0-1.2 V, any new design approach (or modification of this circuit) can require a supply voltage of greater than 1.2 V. Thin-ox transistors can be used, but only if the maximum voltage across any two of the thin-ox transistor's terminals never exceeds 1.2 V. Thick-ox transistors can be used without this limitation, and are able to tolerate up to 2.5 V across any two terminals. Note that these voltages can apply to a specific 65 nm process, which was chosen for the FLORA project. The principles, however, discussed herein can apply to different processes with different voltage ratings. The general principle requires maximizing the input voltage swing to the ADC to relax the matching requirements of capacitors as well as minimizing the size of the DAC capacitors.

Figure 7:
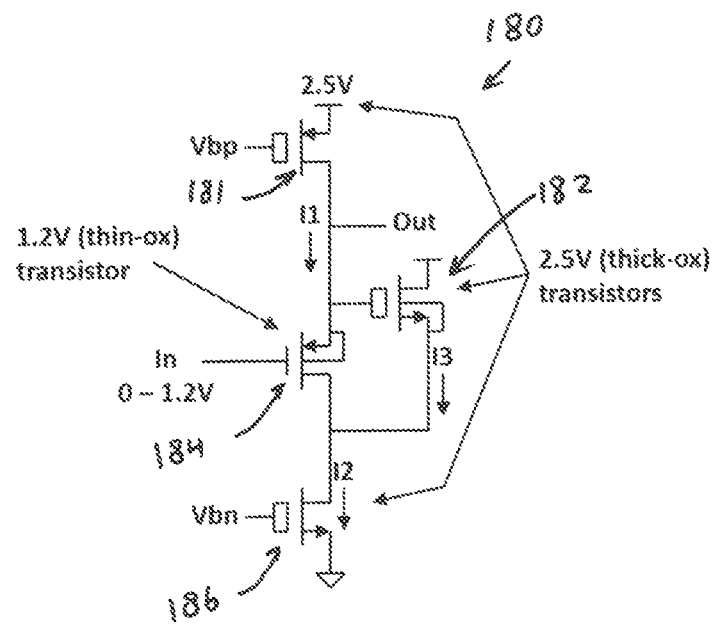
FIG. 7 illustrates a schematic diagram depicting a Version A embodiment of a high-performance follower circuit, in accordance with an embodiment.

FIG. 7 illustrates a schematic diagram depicting a Version A embodiment of a high-performance follower circuit 180, in accordance with an embodiment. The high-performance follower circuit 180 shown in FIG. 6 can include a transistor 181 connected to a transistor 182 (e.g., a 2.5 V (thick-ox) transistor), which in turn can be connected to a transistor 184 (e.g., a 1.2 V (thin-ox) transistor). Both the transistor 182 and the transistor 186 can be connected to a transistor 186, which in turn is connected to ground and is subject to a voltage Vbn. Note that the transistor 181 is subject to a voltage Vbp.

FIG. 7 depicts a modification to the enhanced follower circuit 170 shown in FIG. 6 and which can extend its range by using an NMOS follower instead of a PMOS follower to set the drain voltage of the input transistor. Both thin-ox and thick-ox transistors can be used to maximize performance while still respecting voltage ratings. Thin-ox transistors typically have higher transconductance and better matching, so are more desirable for the input transistor. Thick-ox transistors are well suited as current sources and for other transistors that are not directly in the signal path, since their drain voltage swing is not limited. Note that the supply voltage of this buffer can be 2.5 V, but the PMOS thin-ox input transistor never sees more than a 1.2 V difference across any two of its terminals.

The Version A follower circuit 180 may not perform well, however, with an input of 0 V, since because the threshold voltage of the thick-ox NMOS follower is typically somewhat larger than that of the thin-ox PMOS input transistor, the I2 current source will have a very low drain-source voltage and will not function as a good current source under this condition. For an input of at least a couple of hundred mV (typically) the performance is quite good, with a gain very close to one (typically ~0.9995) and extremely low input capacitance (typically ~0.1 fF). The positive large-signal slew rate is determined by I1, and the negative slew rate by (I2–I1). For equal slew rate in both directions, I2 must be set to 2(I1).

In the implementation shown in FIG. 7, the NMOS follower has its bulk tied to its source, which requires a process with deep N-wells, and is quite area intensive. This may be acceptable for some applications, but is a big disadvantage when the layout must be in a small pixel. If a deep N-well is not used for the NMOS follower, then much less layout area is used and the NMOS bulk is the chip substrate. However, this somewhat reduces the buffer gain (typically 0.9985) and increases the input capacitance (typically 0.3 fF)

Figure 8:
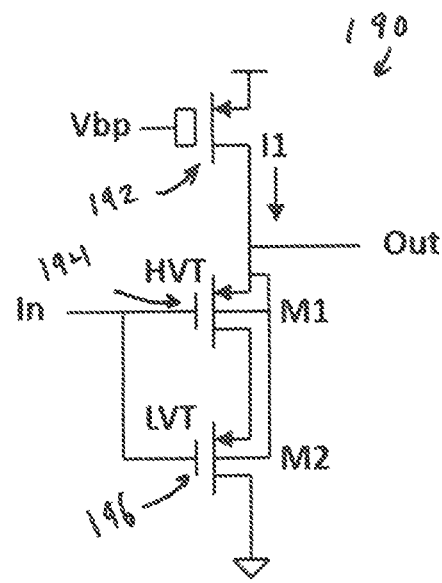
FIG. 8 illustrates a schematic diagram depicting a Version B embodiment of a high-performance follower circuit, in accordance with another embodiment.

A different approach may be required to design a high-performance buffer with all the characteristics required for the FLORA pixel. The concept behind this new technique is shown in the Version B follower circuit 190 of FIG. 8. FIG. 8 illustrates a schematic diagram depicting a Version B embodiment of a high-performance follower circuit 190, in accordance with another embodiment. As shown in FIG. 8, the high-performance follower circuit 190 can include a transistor 192 that can be electronically connected to a transistor 194 (i.e., labeled as "M1" in FIG. 8), which in turn can be electronically connected to a transistor 196 (i.e., labeled as 'M2' in FIG. 8).

The configuration shown in FIG. 8 may require the availability of both High Voltage Threshold (HVT) and Low Voltage Threshold (LVT) thin-ox transistors. M1 (HVT) buffers the input signal, so that the source of M1 follows the input. M2 (LVT) causes the drain of M1 to also (very nearly)

follow the input. Since the gate-source voltage of M2 is guaranteed to be significantly lower in magnitude than that of M1, the drain-source voltage of M1 is therefore held relatively constant (at the difference between HVT and LVT thresholds, which is typically several hundred mV and always enough to guarantee that M1 is in the saturation region).

This new concept performs quite well given its extreme simplicity and possesses several properties. For example, the slew rate for large signals in the positive direction can be limited by I1, but for negative signals is much faster. Therefore, a large negative input can cause a significant spike in the ground supply current, which may be problematic for certain designs. For the FLORA application, this version suffers from a range problem: when the input is near the top of the required 0-1.2 V range, the voltage across M2 (drain to source) exceeds 1.2 V. Therefore, the useable range of this follower is from zero to somewhat less than 1 V. Additionally, since the M2 drain is grounded, it does not follow the M2 source, and therefore the M1 drain will very nearly (but not exactly) follow the input signal. The gain is very near ideal (typically 0.9998), and the input capacitance very low (typically 0.3 fF), but the performance can be slightly better if the M2 drain follows the input.

Figure 9:
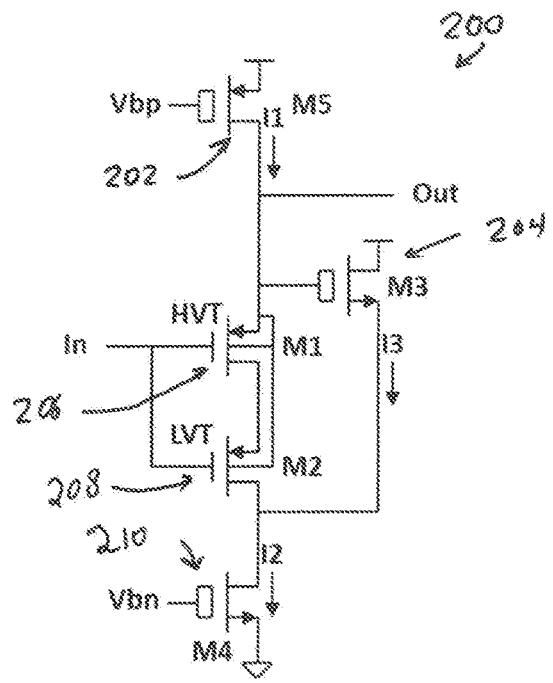
FIG. 9 illustrates a schematic diagram depicting a Version C embodiment of a high-performance follower circuit, in accordance with yet another embodiment.

These issues can be addressed by the modification shown in FIG. 9. That is, FIG. 9 illustrates a schematic diagram depicting a Version C embodiment of a high-performance follower circuit 200, in accordance with another embodiment. The high-performance follower circuit 200 can include a transistor 202 (labeled as "M5" in FIG. 9 that is electronically connected to a transistor 204 (labeled as "M3" in FIG. 9) whose input is electronically connected to a transistor 206 (labeled as "M1" in FIG. 9) and whose output is electronically connected to a transistor 208 (labeled as "M2" in FIG. 9) and a transistor 210 (labeled as "M4" in FIG. 9). Note that the transistor 210 is subject to a voltage Vbn and the transistor 202 is subject to a voltage Vbp.

In general, an NMOS follower (M3) and a current source (M4) can be added so that the drain of M2 very nearly follows the input signal. This modification solves the overvoltage problem, and since the drain of M2 now very nearly follows the input, the buffer gain is extremely close to 1 (typically 0.9998), and the input capacitance is negligible (typically <0.1 fF). Even when the input is set to zero, M4 still has at least 100 mV drain-source voltage bias, since the magnitude of the Vgs of M1 (HVT) is bigger than that of M3, allowing operation over the full range of 0-1.2 V.

The positive slew rate can be determined by I1, and the negative slew rate by (I2−I1). This version of high-performance follower may be useful and adequate for some applications, but still has a vulnerability when used in a large pixel chip like FLORA. The I1 PMOS current source (M5) and I2 NMOS current source (M4) must each have their own reference transistors, and these references are relatively far away from some of the pixels. Matching accuracy decreases with distance, and furthermore, the error in PMOS current matching is not necessarily correlated with the error in NMOS matching. In addition, any IR drop on the power and ground busses will also affect the value of I1 and I2 current sources respectively. Since the NMOS current source M4 must operate with low drain-source voltage (when the input is 0 V), it must have a relatively low gate-source voltage (unlike the PMOS current source M5), worsening the matching accuracy of the negative current source as compared to the positive current source. If the slew rate capability of the follower is desired to be equal in both directions (as for FLORA), then instead of setting I2=2(I1), I2 must be set considerably higher in order that the negative slew rate is high enough under the worst case matching and IR drop errors. This increases power dissipation significantly, which is typically not desirable.

Figure 10:
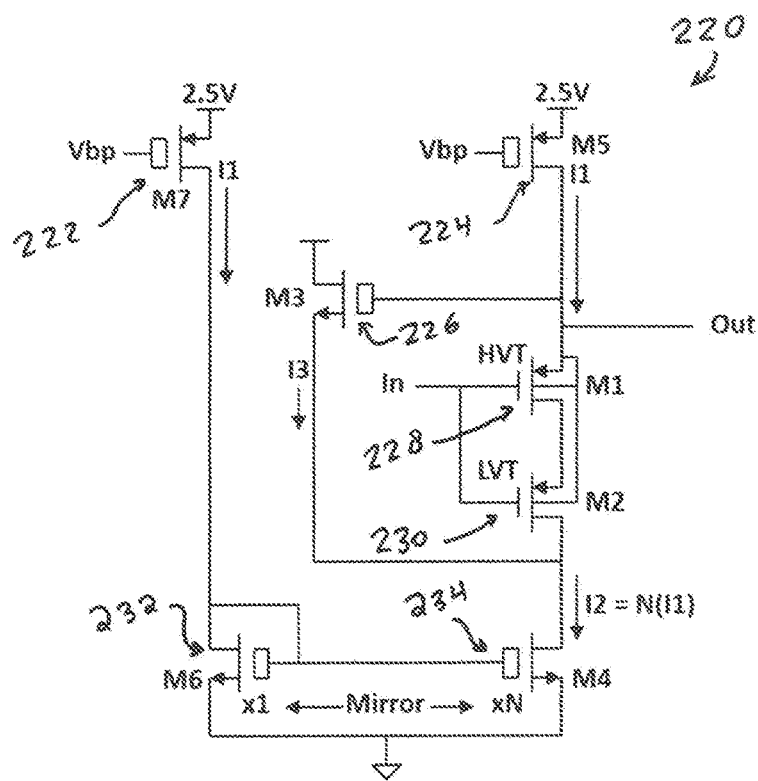
FIG. 10 illustrates a schematic diagram depicting a Version D embodiment of a high-performance follower circuit, in accordance with still another embodiment.

FIG. 10 illustrates a schematic diagram depicting a Version D embodiment of a high-performance follower circuit 220, in accordance with another embodiment. The high-performance follower circuit 220 includes a transistor 222 (labeled as "M7" in FIG. 10) that is connected to a voltage supply (2.5 V) and is subject to a voltage Vbp. A current I1 flows from the transistor 222 to a transistor 232 (labeled "M6" in FIG. 10). That is, the transistor 222 can be electronically connected to the transistor 232. The transistor 232 is electronically connected to a transistor 234 (labeled "M4" in FIG. 10).

The high-performance follower circuit 220 can include a transistor 224 (labeled "M5" in FIG. 10) that is connected electronically to a transistor 226 (labeled "M3" in FIG. 10) and a transistor 228 (labeled "M1" in FIG. 10). The transistor 228 is in turn electronically connected to a transistor 230 (labeled "M2" in FIG. 10). The transistor 226 and the transistor 230 are also electronically connected to the transistor 234. A current I1 flows from the transitory 223 to the transistor 226 and the transistor 228. A current I3 flows from the transistor 226 to the transistor 230 and the transistor 234. A current I2 flows from the transistor 230 and the transistor 226 to the transistor 234.

The slew rate matching problem of the Version C follower is addressed in the Version D design configuration, shown in FIG. 10. In the approach depicted in FIG. 10, the I2 current source can be generated from a second positive current source of magnitude I1. As pointed out earlier, the positive current sources can be high quality current sources since there is plenty of positive voltage headroom, allowing the current sources to have significant length and a relatively large gate-to-source voltage. This results in the best matching and least sensitivity to power bus IR drops that can be achieved.

The added I1 current source (M7) can be used to drive an NMOS current mirror that determines the I2 current. Since this is a local current mirror (M4 and M6 are in close proximity), the mirror matching will be quite good and IR drop in the ground bus will have no effect on the current mirror ratio. Thus, the I2 current can be more accurately set than in the Version C design. For equal slew rate in both directions, the current mirror ratio should be set to N=2. However, this configuration does incur a power dissipation penalty due to the added reference current through M7 and M6.

The properties of Version D are summarized as follows. First, only identical positive current sources may be used, requiring one positive bias current reference per chip. In a large pixel chip, the positive current sources will match fairly well since adequate voltage headroom allows the PMOS length to be much larger than minimum and Vgs to be big. Second, in a large pixel chip, the negative current source can be formed from a local NMOS mirror in each pixel, so NMOS matching is good and the magnitude of I2 is not affected by IR drops in the ground bus. In addition, the configuration shown in FIG. 10 offers near-perfect characteristics (e.g., gain ~0.9998, input capacitance <0.1 fF) and is highly linear, with a full input range of at least 0-1.2 V. In addition, the configuration shown in FIG. 10 possesses constant ground and supply currents, even when slewing. There is, however, a power dissipation penalty due to added positive current source (M7).

Figure 11:
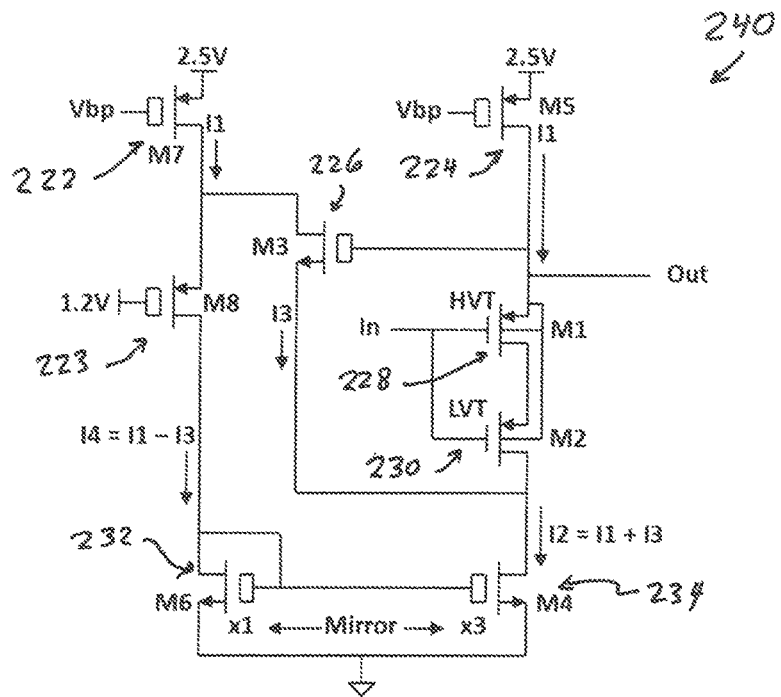
FIG. 11 illustrates a schematic diagram depicting a Version E embodiment of a high-performance follower circuit, in accordance with an alternative embodiment.

FIG. 11 illustrates a schematic diagram depicting a Version E embodiment of a high-performance follower circuit 240, in accordance with another embodiment. Note that the high-performance follower circuit 240 depicted in FIG. 11 is similar to the high-performance follower circuit 220 shown in FIG. 10, with some subtle but important differences. For example, in the high-performance follower circuit 240 depicted in FIG. 11, a transistor 223 can be included (labeled "M8" in FIG. 11), which is electronically connected to the transistor 222 and the transistor 232, and also the transistor 226.

The power dissipation of the Version D configuration (i.e., see FIG. 10) can be significantly reduced while maintaining slew rate with the Version E follower circuit 240 shown in FIG. 11. This is a final version of the high-performance follower, and is a design used in the FLORA chip. In this circuit, the positive slew rate can be determined by I1, as usual. The negative slew rate, however, can be enhanced on demand, allowing lower quiescent bias current. This is accomplished by connecting the M3 drain to the M7 drain (instead of to the positive supply) so that it takes a portion of the M7 current, and the current to M6 is reduced to I1-I3.

In FIG. 11, the mirror ratio can be set to 3 (as it is in the FLORA design, although it could be otherwise), which forces I3 to be half of I1. The negative bias current of M4 is then 1.5×I1. Now, when there is a large negative input signal, the M3 current goes to zero and allows all the M7 current to go to the mirror. Therefore in this example, the M4 current during large-signal negative slewing is 3×I1, yet the total quiescent bias current is only 2×I1. This insures that even in the presence of worst case transistor mismatch, the negative slew rate is at least as fast as the positive slew rate.

The properties of the Version E (for FLORA) follower circuit 240 can be summarized as follows. First, only identical positive current sources can be used, requiring one current reference. These current sources can match quite well since adequate voltage headroom allows the PMOS length to be much larger than minimum and Vgs to be big. Additionally, the negative current source can be formed from a local NMOS mirror in each pixel, so NMOS matching is "good", and the magnitude of I2 may not be affected by IR drops in the ground bus.

The Version E high-performance follower circuit 240 also offers an enhanced negative slew rate. That is, for large negative signals, M3 turns off and the negative current source increases in value to I2=3×I1 while slewing. Therefore, the negative slew rate may be somewhat faster than the positive slew rate, and even with worst case mirror mismatch, the negative slew rate may be no slower than the positive slew rate. The high-performance follower circuit 240 also offers near-perfect characteristics (e.g., gain ~0.9998, input capacitance <0.1 fF), and is highly linear, with a full input range of at least 0-1.2 V. The ground supply current may increase during large-signal negative slewing.

As mentioned before, the performance of the comparator is crucial in achieving the desired ADC specifications. The comparator must have an input signal range of 0-1.2 V, a constant offset over the whole range, and virtually no input capacitance. A high-performance comparator can be derived by driving the inputs of a comparator with high-performance followers, as shown in FIG. 11. Since the followers have a DC level shift of approximately 0.6 V, the comparator itself must then have an input range of 0.6-1.8 V, with a constant offset over that whole range.

Figure 12:
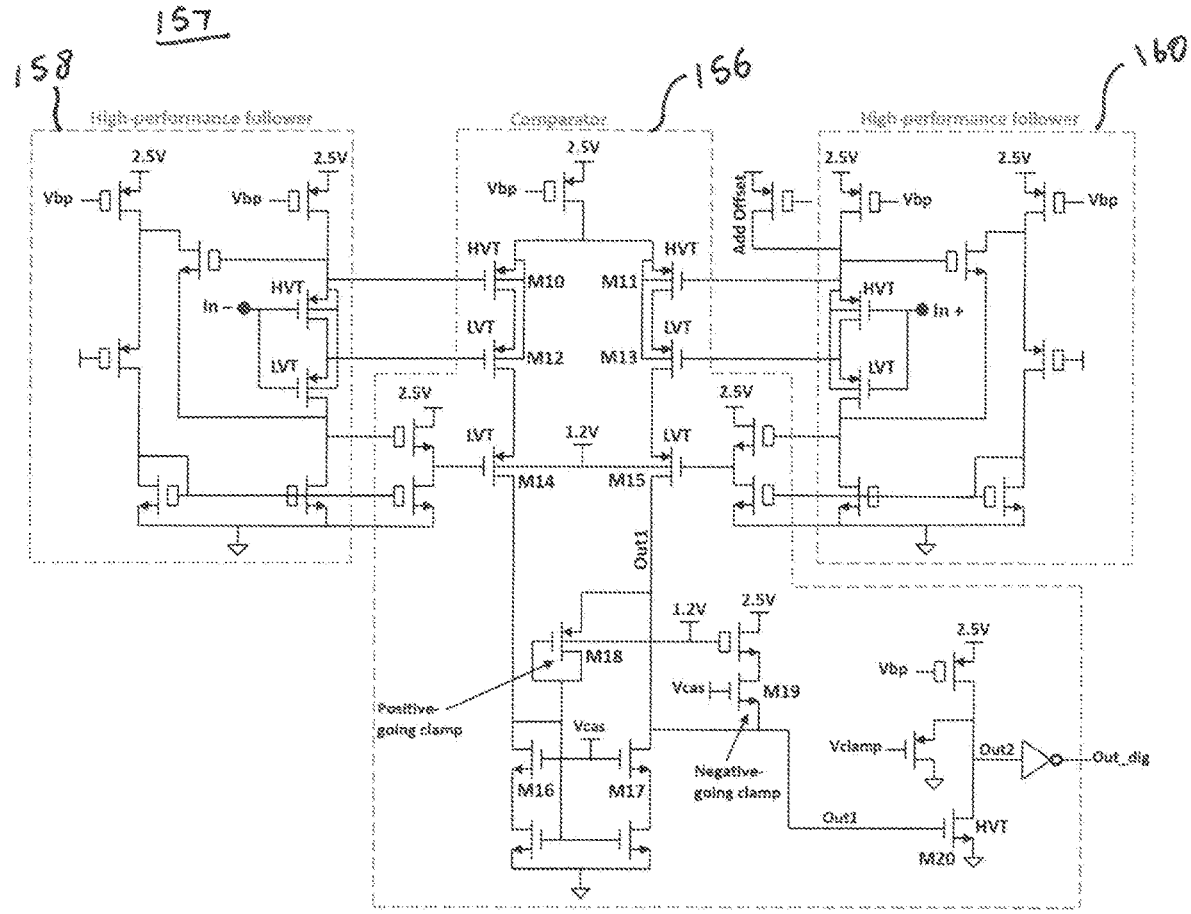
FIG. 12 illustrates a schematic diagram of a high-performance comparator circuit, in accordance with an embodiment.

FIG. 12 illustrates a schematic diagram of a high-performance comparator circuit 157, in accordance with an embodiment. The HVT-LVT concept used in the high-performance follower can also be used to achieve the constant offset requirement of the comparator. Since the positive rail of the comparator bias is 2.5 V, there is still enough headroom for the comparator inputs to operate at up to 1.8 V. The gates of the comparator HVT and LVT input transistors (M10-M13) can be conveniently driven by the followers as shown in FIG. 11, due to the naturally similar architectures.

To avoid overvoltage on M12 and M13, cascode transistors M14 and M15 can be added and biased from a shifted version of the high-performance follower output. Such cascode transistors also help to boost the comparator gain seen at node Out1 (the first comparator output) to approximately 1400. A set of transistor clamps (M18 and M19) limits the Out1 voltage swing, which keeps M15 and M17 always in saturation, thereby keeping the speed as high as possible, and preventing any overvoltage on thin-ox transistors.

Since the gain of the first stage of the comparator is already quite high, a very simple second stage is adequate to provide enough additional gain and shaping to feed a digital buffer. The voltage gain from the input to the Out2 node is greater than 30,000. The comparator can therefore easily resolve input differences that are significantly less than 1 mV. Because the transistor clamps limit the voltage swing and always keep all transistors in saturation mode, even sub-mV input signals are resolved within 200 ns.

One of the high-performance followers can have an additional bias current added to force an effective offset at the comparator inputs. When the comparator is used in an ADC, this effective comparator offset (instead of 0 V) defines the nominal "bottom" of the ADC, so that the ADC can digitize a differential input of 0 even in the presence of the worst-case random mismatch of all the transistors in the signal path.

Figure 13:
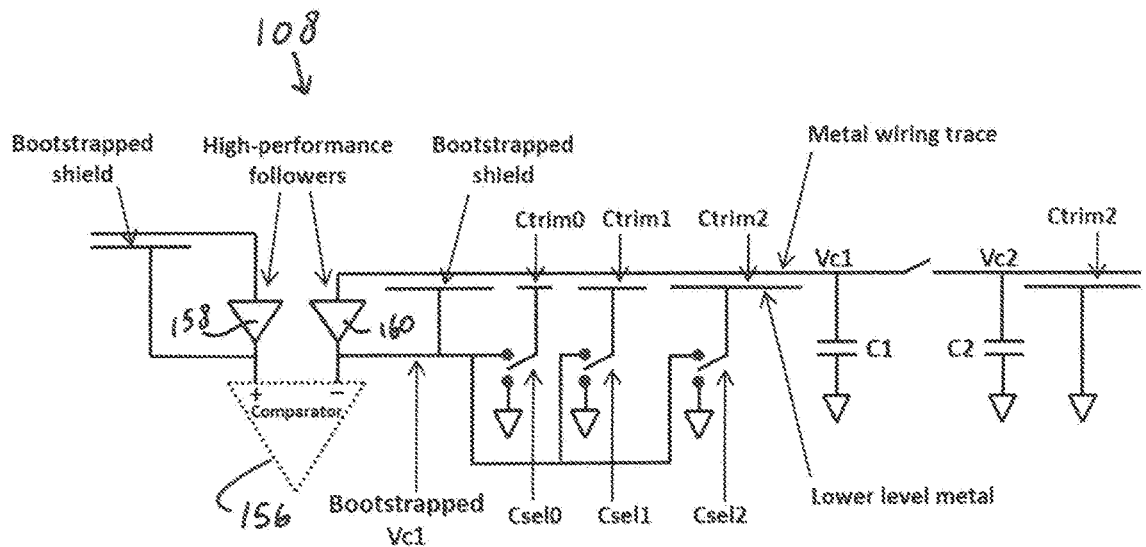
FIG. 13 illustrates a schematic diagram of a capacitor trimming circuit, in accordance with an embodiment.

FIG. 13 illustrates a schematic diagram of the capacitor trimming circuit 108, in accordance with another embodiment. FIG. 13 depicts the relevant part of the FLORA ADC that can implement the new sub-fF capacitance trimming method. The goal is to trim the value of C1 to be equal to the value of C2 (approximately 200 fF in the FLORA ADC). The presence of the high-performance follower is what enables this technique, and the capacitor trim values can be very small (down to tens of aF).

The high-performance follower has almost zero input capacitance and therefore does not load C1. In addition, a nearly perfect replica of Vc1 exists at the output of the follower (with just a DC offset). Therefore, the follower output can be used to drive a bootstrapped shield on a lower level of metal, which effectively cancels the parasitic capacitance to ground that exists on the metal wiring trace between C1 and the follower input. Part or all of this shield can be broken up into sections to form small trim capacitors, each of which are either connected to the follower output (bootstrapped resulting in no added capacitance) or to ground (forming an added capacitance to ground).

The trim capacitors can be arbitrarily sized, but would typically have binary-weighted values that are selected with a digital code (Csel 0-2 in this example). The value of the largest trim capacitor should be at least as big as the largest expected mismatch between the capacitors that are being trimmed (C1 and C2 in this example). This value of capacitance is added to C2, so that C1 is guaranteed to be smaller than C2 with no trim capacitors connected to ground, and larger than C2 with all trim capacitors connected to ground.

The heart of an N-bit serial ADC was shown previously in FIG. 2. After resetting the DAC by discharging C1, N redistribution cycles must be performed to obtain an N-bit analog output voltage on C2. A redistribution cycle consists of charging C2 to either a "0" or a "1" (to either ground or Vref, where Vref is the maximum analog voltage of the DAC output), and then closing the Qequal switch to redistribute the charge equally on both caps. The LSB of the digital DAC input must always be presented first, and the MSB last.

When an N-bit serial DAC is incorporated into an N-bit ADC as shown in FIG. 2, the ADC bits are determined one at a time. Digital logic must perform N different DAC conversions, and the analog output level of each of these N conversions is compared with the ADC input voltage to determine the next ADC bit. At any given point in the ADC conversion process, all the ADC bits that are known at that time are used to form the next DAC conversion voltage. An existing solution that accomplishes this is shown as a 4-bit ADC (to serve as an example and deriving other ADC resolution from this example is straightforward) in FIG. 14, along with a corresponding timing diagram in FIG. 15.

Figure 14:
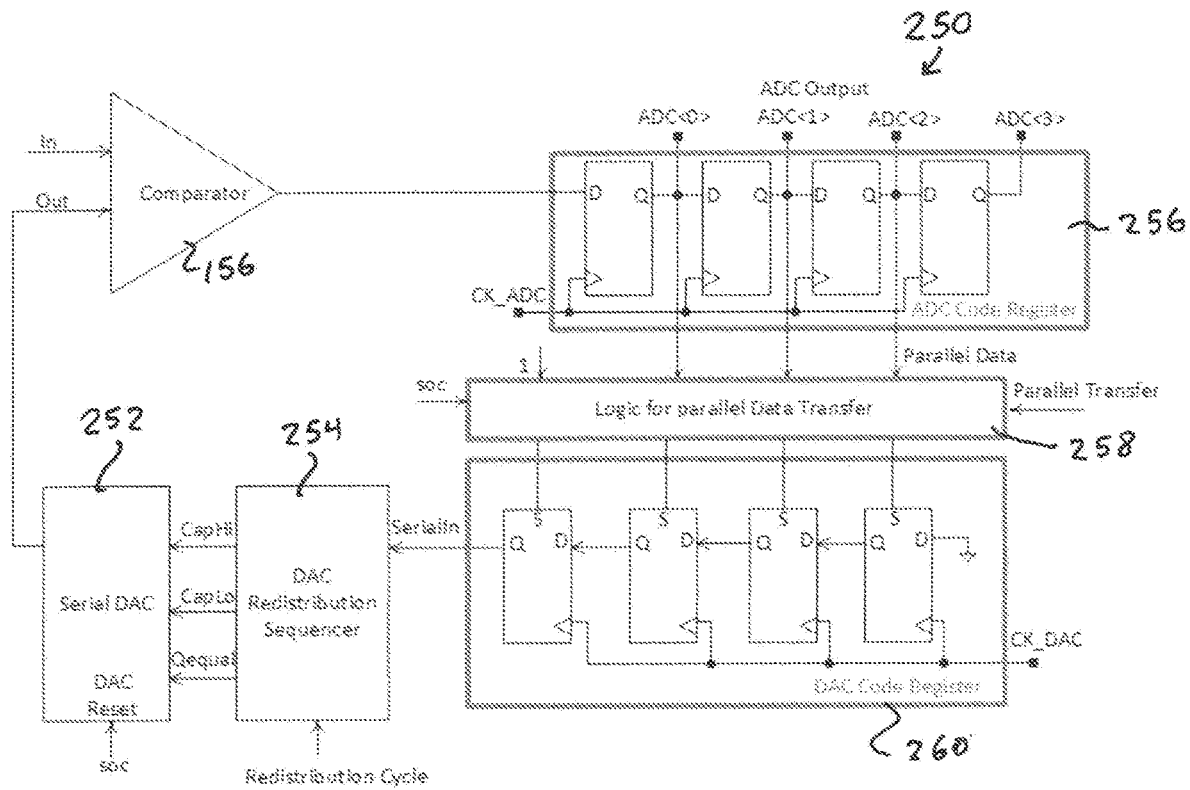
FIG. 14 illustrates a schematic diagram of a 4-bit serial ADC circuit, in accordance with an embodiment.

FIG. 14 illustrates a schematic diagram of a 4-bit serial ADC circuit 250, in accordance with an embodiment. As depicted in FIG. 14, the 4-bit serial ADC circuit 250 can include a comparator 256 that can be electronically connected to an ADC code register 256, which in turn can connect to a logic circuit 258 for parallel data transfer. The logic circuit 258 can be subject to a parallel transfer signal ("Parallel Transfer"). The logic circuit 258 can be in turn electronically connected to a DAC code register 260, which in turn can provide a serial input signal ("SerialIn") to a DAC redistribution sequencer 254 that in turn can provide a CapHi signal, a CapLo signal and a Qequal signal to a serial DAC 252.

Figure 15:
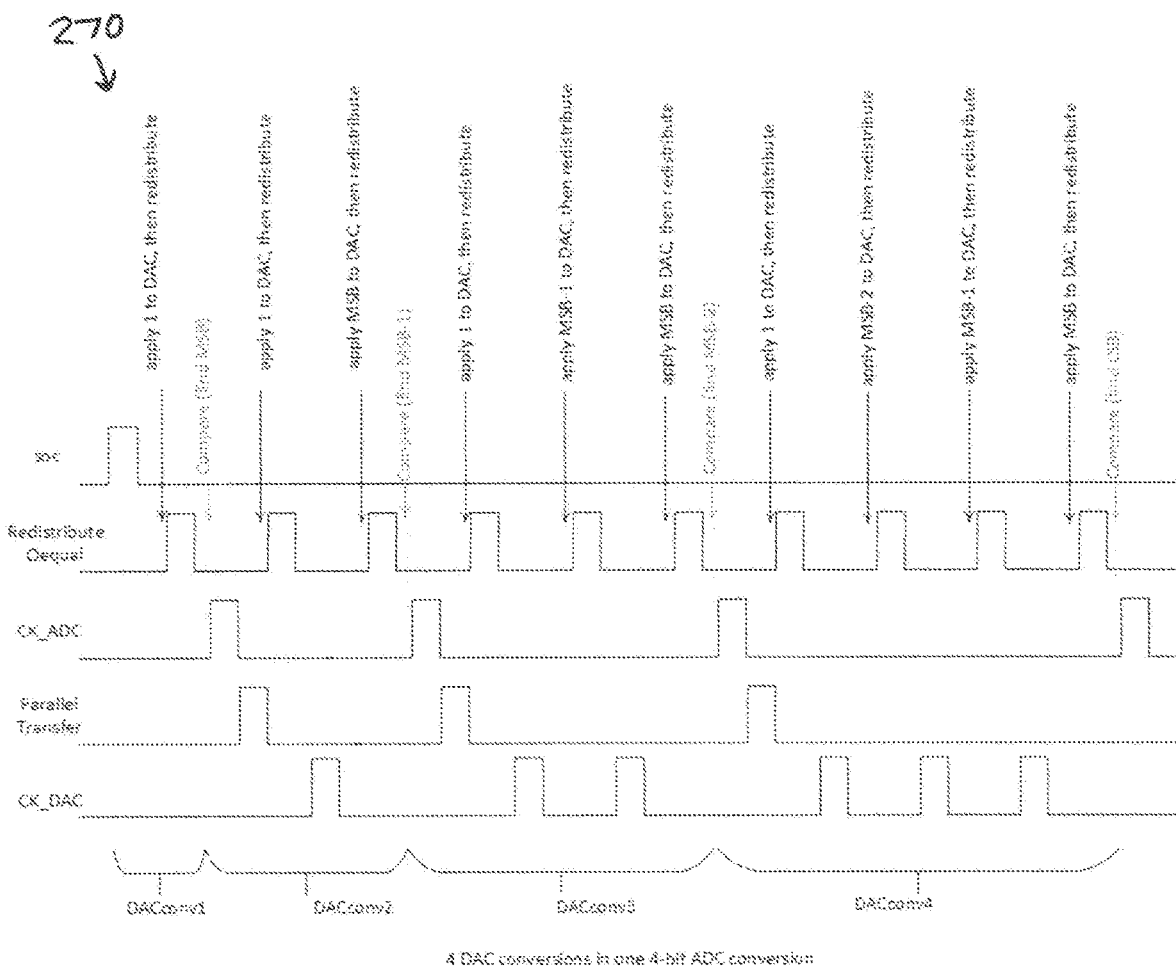
FIG. 15 illustrates a timing diagram depicting the timing diagram of a 4-bit serial ADC, in accordance with an embodiment.

FIG. 15 illustrates a timing diagram 270 depicting the timing diagram of the 4-bit serial ADC circuit 250, in accordance with an embodiment. A given DAC conversion can be initiated by presenting a "1" to the serial input of the DAC, followed by each of the ADC bits that have been already determined. A 4-bit ADC conversion can be therefore performed by sequentially performing four DAC conversions and presenting those four analog DAC outputs to the comparator to be compared with the input. The result of these four comparisons can provide the final ADC code.

The MSB of the ADC can be determined first, simply by presenting a "1" to the serial input of the DAC, redistributing the charge, and comparing the DAC output to the ADC input. This result is shifted into the ADC Code Register with CK_ADC. For the $2^{nd}$ DAC conversion, a parallel transfer is done from the ADC Code Register to the DAC Code Register. The $2^{nd}$ DAC conversion then again starts with a "1" to the serial input of the DAC and a redistribution cycle. This is followed by shifting in the ADC bit (MSB) that has already been determined (with the CK_DAC signal) and another redistribution cycle.

The result of the $2^{nd}$ DAC conversion comparison gives the next ADC bit and is shifted into the ADC Code Register. After another parallel transfer, the $3^{rd}$ conversion is done, again starting with a "1", followed by the least significant ADC bit so far (MSB−1), and then the MSB. Note that each DAC conversion cycle adds another serial DAC input bit, and takes progressively longer to determine the next ADC bit. Also, when the known ADC bits are shifted into the DAC, the least significant bit that is known is shifted in first, and the last bit to be shifted in is the ADC MSB. The straightforward circuit 250 shown in FIG. 14 shifts ADC bits to the right, then transfers them to the DAC Code Register, which shifts them left into the DAC.

The 4-bit serial ADC circuit 250 shown in FIG. 14 can be utilized as a simple and effective configuration. However, one of its disadvantages may be that every clocking or transfer operation can result in all the flip-flops being clocked, and potentially all the flip-flops changing state (depending on the register states). This can result in significant power consumption and potentially significant transient noise on the digital power busses. In addition, for a pixel chip with an ADC in every pixel, both the ADC and DAC code registers must be implemented in each pixel. A new configuration is proposed below which minimizes clocking operations to reduce power consumption and allows sharing of some registers among multiple pixels to reduce layout area and further reduce power consumption.

Figure 16:
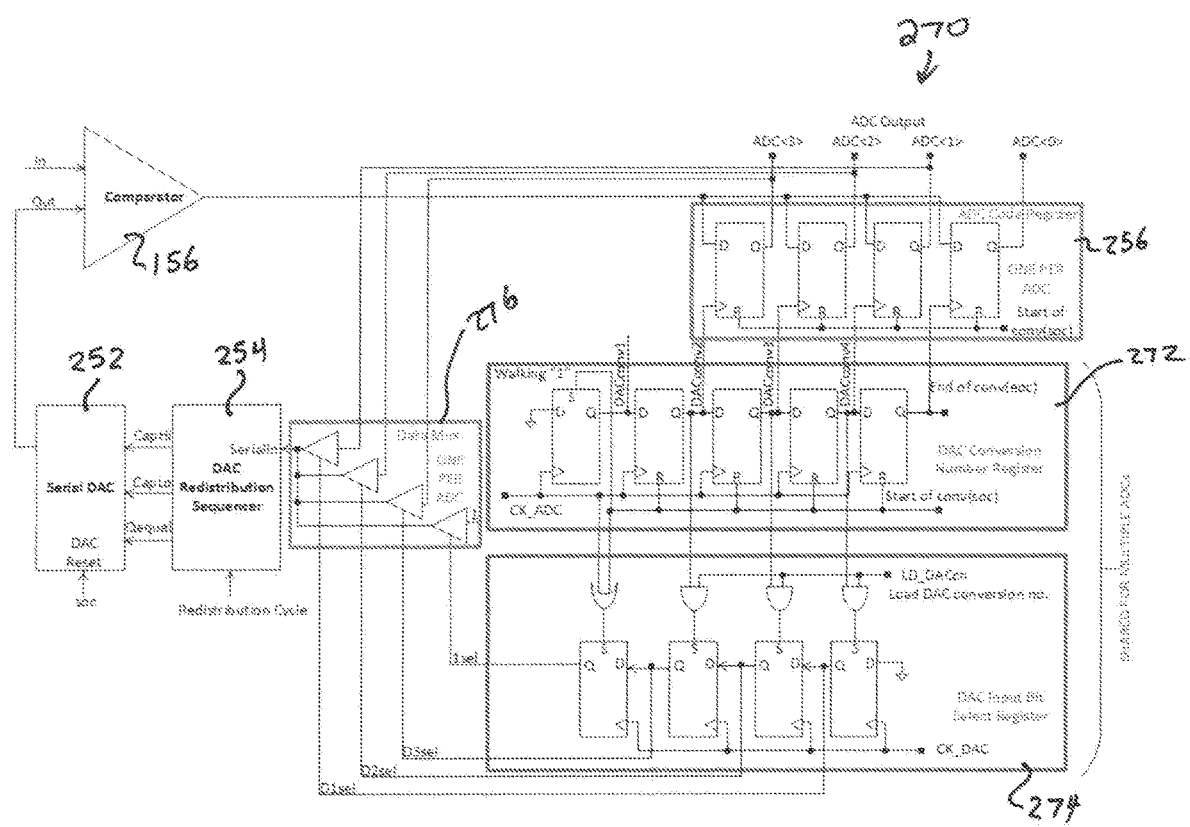
FIG. 16 illustrates a lower power, compact 4-bit serial ADC, in accordance with an embodiment.
Figure 17:
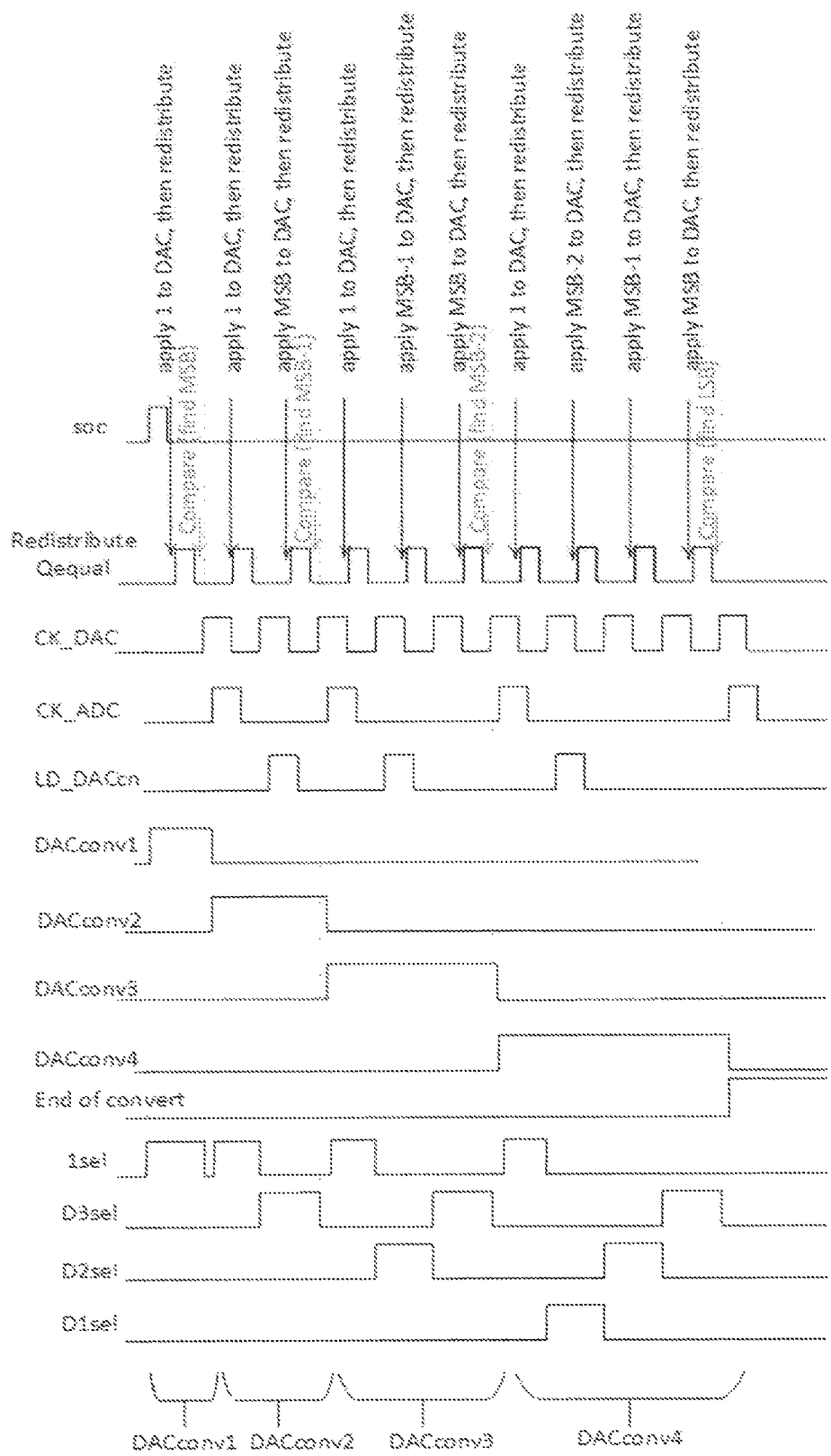
FIG. 17 illustrates a timing diagram of a 4-bit serial ADC, in accordance with another embodiment.

FIG. 16 illustrates a lower power, compact 4-bit serial ADC circuit 270, in accordance with an embodiment. FIG. 17 illustrates a timing diagram 280 of the 4-bit serial ADC circuit 270, in accordance with an embodiment. The lower power, compact 4-bit serial ADC circuit 270 shown in FIG. 16 includes a comparator 156 that can be electronically connected to an ADC code register 256, which in turn is electronically connected to a DAC conversion number register 272, which in turn is electronically connected to a DAC input bit select register 274. The DAC input bit select register 274 in turn connects electronically to a data multiplexer 275 ("Data Mux") whose output is input to the DAC redistribution sequencer 254 that in turn connects electronically to the serial DAC 252. Output from the serial DAC 252 can be fed as input to the comparator 156.

FIG. 16 thus depicts a diagram of the new configuration, and FIG. 17 the corresponding timing diagram. Again, a 4-bit ADC circuit can be depicted for illustration purposes. This new strategy avoids any shifting or transferring of ADC data. Therefore, the ADC Code register simply acquires and holds data one bit at a time. When ADC bits need to be presented to the serial DAC input, instead of shifting them, a data multiplexer simply selects which of the ADC registers to connect to the DAC input.

The DAC Conversion Number Register starts with a "1" loaded into only the leftmost register, and after each DAC conversion, the "1" is shifted to the right with CK_ADC. This register therefore implements a "walking 1" that simply advances the circuit to the next DAC conversion. Realization of the "walking 1" pattern can be done as shown in FIG. 16 or in other form, for example exploiting the Johnson's counter. Each clock pulse to this register therefore results in only two flip-flops changing state. Each output serves as the dedicated clock input to the corresponding ADC Code Register flip-flop. Therefore, the flip-flops in the ADC Code Register are never shifted, but each simply acquires and holds its data. A DAC Input Bit Select Register is used to control the data multiplexer, which selects the ADC bits in the proper order for whichever DAC conversion is taking place. This avoids having to transfer the ADC bits to a DAC control register and shift them into the DAC, as in the previously explained existing solution.

The DAC Input Bit Select Register always selects a "1" to pass to the DAC input first. Starting with the $2^{nd}$ DAC conversion, and after the initial "1" is passed to the DAC input, the LD_DACcn (Load DAC conversion number) signal sets just one of the flip-flops to a "1", depending on which DAC conversion is taking place. This "1" is then shifted (walked) to the left with CK_DAC to multiplex the ADC bits to the serial DAC input in the proper order.

Since both the DAC Conversion Number Register and the DAC Input Bit Select Register perform basic timing and control functions, they can be shared among a group of multiple ADCs, resulting in significant area and power savings.

A positive logic solution is shown in the circuit diagrams. There are several circuit variations for the same concept. An important innovation derives from the following: implementing a low power solution by reducing the number of transitions; sharing common logic between pixels (to reduce the number of registers within a pixel); and reusing the DAC conversion number register for DAC control by enabling the stored bits (using tri-state buffers and DAC input bit select register).

The disclosed embodiments describe and illustrate the use of a high-performance follower, which can use both high-voltage-threshold and low-voltage-threshold input transistors connected in a specific way (along with supporting circuitry), which provides the properties of unity gain, zero input capacitance, and input range equal to a full swing of the nominal supply voltage. This novel approach can be used for a number of applications and devices, not just ADCs. The disclosed approach can enable a low-area ADC, but the configuration of the ADC is a simple charge-redistribution type. What renders the disclosed charge-redistribution ADC interesting and unique is that it uses a high-performance follower (or multiple high-performance followers) in several different ways to achieve good ADC performance in a very small area. That is, a small area can be achieved by using the disclosed high-performance follower (along with the comparator and trimming that the follower design enables). The principle of sharing of logic also enables a reduction in ADC area, and applicable in the context of the disclosed ADC, but is also useful in a more general sense (in non ADC devices applications).

The analog circuitry can stem from the high-performance follower(s). This follower, along with the principle of combining high-voltage-threshold and low-voltage-threshold input transistors in the manner implemented in the disclosed follower, can be used to construct a high-performance comparator, which can be used be needed for ADC applications and non-ADC applications. This disclosed comparator can also be implemented in a number of applications, and can be constructed using the disclosed high-performance follower(s).

Based on the foregoing, it can be appreciated that a number of embodiments are disclosed herein. For example, in one embodiment an ADC (Analog-to-Digital Converter) circuit, can be implemented, which includes at least one comparator; a serial DAC (Digital-to-Analog Converter) circuit that provides a signal to the at least one comparator; a serial DAC redistribution sequencer that provides a plurality of signals as input to the serial DAC circuit and is subject to a redistribution cycle and which receives as input a signal from a data multiplexer whose input connects electronically to an output of the at least one comparator; an ADC code register that provides an ADC output that connects electronically to the output of the at least one comparator and the input to the data multiplexer; and shared logic circuitry for sharing common logic between pixels, wherein the shared logic circuitry connects electronically to the data multiplexer and the ADC code register, wherein the shared logic circuitry promotes area and power savings for the pixel detector circuit.

In an embodiment, the shared logic circuitry can be configured to include a DAC conversion number register and a DAC input bit select register that perform timing and control functions, wherein the DAC conversion number register and the DAC input bit select register are shared among a group of multiple ADCs resulting in the area and the power savings. In another embodiment, the DAC conversion number register is reusable for DAC control by enabling stored bits using at least one tri-state buffer and the DAC input bit select register.

In yet another embodiment, the at least one comparator can operate with an input signal range equivalent to the full swing (of nominal supply voltage) and a constant offset over an entire signal range with no input capacitance. In another embodiment, the at least one comparator can include a high-performance comparator derived by driving inputs of the at least one comparator with high-performance followers.

In some embodiments, the at least one comparator is electronically connected to at least one high-performance follower. In still other embodiments, the at least one comparator is electronically connected to a plurality of high-performance followers. In another embodiment, the analog circuit section includes a capacitor trimming circuit.

In still other embodiments, the analog circuit section can be configured to further include a dynamic range unity-gain buffer with zero input capacitance. In another embodiment, the analog circuit section can be further configured to include a high-gain, wide common-mode range comparator with a constant offset, wherein the at least one comparator includes the high-gain, wide common-mode range comparator.

In another embodiment, a circuit can be implemented which can include at least one unity-gain buffer having a zero input capacitance; a comparator having a constant offset invariant of signal and common mode, wherein the comparator is electrically connected to the at least one unity-gain buffer; and a capacitor trimming circuit that is electrically connected to the comparator via the at least one unity-gain buffer.

In an embodiment the at least one unity-gain buffer can comprise a high-performance follower.

In an embodiment of the circuit, the comparator can comprise a high-gain, wide common mode range comparator with an input signal range equivalent to a full swing of nominal supply voltage.

In an embodiment of the circuit, the capacitor trimming circuit can facilitate sub-fF capacitor trimming suitable for a reduced chip area occupancy. In another embodiment, the sub-fF capacitor trimming can be facilitated by electronic bootstrapping an electrode of a capacitor via the at least one unity-gain buffer. In yet another embodiment, the sub-fF capacitor trimming can be facilitated by connecting an electrode of a capacitor to a constant voltage source.

In an embodiment, a circuit can include at least one high-performance follower that combines at least one high-voltage-threshold transistor and at least one low-voltage-threshold transistors with surrounding circuitry to achieve a unity gain, zero input capacitance, and a wide input signal range equal to a full swing of a nominal supply voltage.

In an embodiment, the circuit can include a high-performance comparator that uses the at least one high-performance follower and the at least one high-voltage-threshold transistor and the low-voltage-threshold transistor to achieve a comparator with a high gain, zero input capacitance, wide input signal range equal to a full swing of the nominal supply voltage, and an invariant input offset over a complete dynamic range.

In an embodiment, the circuit can include a capacitance trimming circuit that uses the at least one high-performance follower and an electronic bootstrapping to achieve a sub-fF capacitance trimming.

In another embodiment, a circuit can include at least one high-performance follower that combines at least one high-voltage-threshold transistor and at least one low-voltagethreshold transistor with surrounding circuitry to achieve a unity gain, zero input capacitance, and a wide input signal range equal to a full swing of a nominal supply voltage; a high-performance comparator that uses the at least one high-performance follower and the at least one high-voltage-threshold transistor and the at least one low-voltage-threshold transistor to achieve a comparator with a high gain, zero input capacitance, wide input signal range equal to a full swing of the nominal supply voltage, and an invariant input offset over a complete dynamic range; and a capacitance trimming circuit that uses the at least one high-performance follower and an electronic bootstrapping to achieve a sub-fF capacitance trimming.

The circuit can also include shared logic circuitry for sharing common logic between pixels, wherein the shared logic circuitry promotes area savings and power savings. The capacitance trimming circuit can be electrically connected to the high-performance comparator via the at least one at least one high-performance follower.

In an embodiment, a circuit, can include at least one comparator; a serial DAC (Digital-to-Analog Converter) circuit that provides a signal to the at least one comparator; a serial DAC redistribution sequencer that provides a plurality of signals as input to the serial DAC circuit and is subject to a redistribution cycle and which receives as input a signal from a data multiplexer whose input connects electronically to an output of the at least one comparator; an ADC (Analog-to-Digital Converter) code register that provides an ADC output that connects electronically to the output of the at least one comparator and the input to the data multiplexer; and shared logic circuitry for sharing common logic between pixels, wherein the shared logic circuitry connects electronically to the data multiplexer and the ADC code register, wherein the shared logic circuitry promotes area and power savings.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A circuit, comprising:
   at least one unity-gain buffer having a zero input capacitance;
   a comparator having a constant offset invariant of signal and common mode, wherein the at least one unity-gain buffer is electrically connected to the comparator; and
   a capacitor trimming circuit that is electrically connected to the comparator via the at least one unity-gain buffer.

2. The circuit of claim 1 wherein the at least one unity-gain buffer comprises a high-performance follower.

3. The circuit of claim 1 wherein the comparator comprises a high-gain, wide common mode range comparator with an input signal range equivalent to a full swing of nominal supply voltage.

4. The circuit of claim 1 wherein:
   the capacitor trimming circuit facilitates sub-fF capacitor trimming suitable for a reduced chip area occupancy.

5. The circuit of claim 4 wherein the sub-fF capacitor trimming is facilitated by electronic bootstrapping electrode of a capacitor via the at least one unity-gain buffer.

6. The circuit of claim 4 wherein the sub-fF capacitor trimming is facilitated by connecting an electrode of a capacitor to a constant voltage source.

7. A circuit, comprising:
   at least one high-performance follower that combines at least one high-voltage-threshold transistor and the at least one low-voltage-threshold transistor with surrounding circuitry to achieve a unity gain, zero input capacitance, and a wide input signal range equal to a full swing of a nominal supply voltage.

8. The circuit of claim 7 further comprising:
   a high-performance comparator that uses the at least one high-performance follower and the at least one high-voltage-threshold transistor and the at least one low-voltage-threshold transistor to achieve a comparator with a high gain, zero input capacitance, wide input signal range equal to a full swing of the nominal supply voltage, and an invariant input offset over a complete dynamic range.

9. The circuit of claim 7 further comprising a capacitance trimming circuit that uses the at least one high-performance follower and electronic bootstrapping to achieve a sub-fF capacitance trimming.

10. A circuit, comprising:
    at least one high-performance follower that combines at least one high-voltage-threshold transistor and at least one low-voltage-threshold transistor with surrounding circuitry to achieve a unity gain, zero input capacitance, and a wide input signal range equal to a full swing of a nominal supply voltage;
    a high-performance comparator that uses the at least one high-performance follower and the at least one high-voltage-threshold transistor and the at least one low-voltage-threshold transistor to achieve a comparator with a high gain, zero input capacitance, wide input signal range equal to a full swing of the nominal supply voltage, and an invariant input offset over a complete dynamic range; and
    a capacitance trimming circuit that uses the at least one high-performance follower and an electronic bootstrapping to achieve a sub-fF capacitance trimming.

11. The circuit of claim 10 comprising shared logic circuitry for sharing common logic between pixels, wherein the shared logic circuitry promotes area savings and power savings.

12. The circuit of claim 11 wherein the capacitance trimming circuit is electrically connected to the high-performance comparator via the at least one at least one high-performance follower.

13. A circuit, comprising:
    at least one comparator; a serial DAC (Digital-to-Analog Converter) circuit that provides a signal to the at least one comparator;
    a serial DAC redistribution sequencer that provides a plurality of signals as input to the serial DAC circuit and is subject to a redistribution cycle and which receives as input a signal from a data multiplexer whose input connects electronically to an output of the at least one comparator;
    an ADC (Analog-to-Digital Converter) code register that provides an ADC output that connects electronically to the output of the at least one comparator and the input to the data multiplexer;
    shared logic circuitry for sharing common logic between pixels, wherein the shared logic circuitry connects electronically to the data multiplexer and the ADC code register, wherein the shared logic circuitry promotes area and power savings.

14. The circuit of claim 13 wherein the shared logic circuitry comprises a DAC conversion number register and a DAC input bit select register that perform timing and control functions, wherein the DAC conversion number register and the DAC input bit select register are shared among a group of multiple ADCs.

15. The circuit of claim 13 wherein the DAC conversion number register is reusable for DAC control by enabling stored bits using at least one tri-state buffer and the DAC input bit select register.

16. The circuit of claim 13 wherein the at least one comparator is operable with an input signal range equivalent to a full swing of nominal supply voltage and a constant offset over an entire signal range and a common mode with no input capacitance.

17. The circuit of claim 13 wherein the at least one comparator comprises a high-performance comparator derived by driving inputs of the at least one comparator with high-performance followers.

18. The circuit of claim 13 wherein the at least one comparator is electronically connected to at least one high-performance follower.

19. The circuit of claim 13 further comprising an analog circuit section comprising a capacitor trimming circuit.

* * * * *